United States Patent [19]
Grodstein et al.

[11] Patent Number: 5,355,321
[45] Date of Patent: Oct. 11, 1994

[54] STATIC TIMING VERIFICATION

[75] Inventors: Joel J. Grodstein, Arlington; Anil K. Jain, Stow; William Grundmann, Westboro, all of Mass.

[73] Assignee: Digital Equipment Corporation, Maynard, Mass.

[21] Appl. No.: 898,920

[22] Filed: Jun. 12, 1992

[51] Int. Cl.$^5$ .................... G06F 15/20; G06F 15/60
[52] U.S. Cl. ........................ 364/489; 364/488
[58] Field of Search ............... 364/488, 489, 490, 491

[56] References Cited
U.S. PATENT DOCUMENTS

| | | | |
|---|---|---|---|
| 5,003,487 | 3/1991 | Drumm et al. | 364/489 |
| 5,095,454 | 3/1992 | Huang | 364/578 |
| 5,113,352 | 5/1992 | Finnerty | 364/490 |
| 5,191,541 | 3/1993 | Landman et al. | 364/489 |
| 5,237,514 | 8/1993 | Curtin | 364/490 |
| 5,251,147 | 10/1993 | Finnerty | 364/490 |

*Primary Examiner*—Thomas G. Black
*Assistant Examiner*—Susan Wieland
*Attorney, Agent, or Firm*—Richard J. Paciulan; Denis G. Maloney

[57] ABSTRACT

A method for static analysis of a software model of a circuit clocked by two clocks where the two clocks' periods are multiples of a greatest common divisor period. In the invention, a composite clock is determined with a period equal to the least common multiple of the periods of the two clocks, and the model is statically analyzed relative to the composite clock.

9 Claims, 23 Drawing Sheets

| NAME |
|---|
| WORST-CASE ARRIVAL TIME |
| WORST-CASE PREDECESSOR |

FIG. 4

| 300→STEP | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|
| 302→TIME | 1 | 12 | 13 | 26 | 27 | 26 | 13 | 32 | 33 | 32 | 13 | 12 | 1 | 8 | 9 | 8 | 1 |
| 304 STACK | A | C<br>A | D<br>C<br>A | E<br>D<br>C<br>A | G<br>E<br>D<br>C<br>A | E<br>D<br>C<br>A | D<br>C<br>A | F<br>D<br>C<br>A | G<br>F<br>D<br>C<br>A | F<br>D<br>C<br>A | D<br>C<br>A | G<br>A | A | B<br>A | D<br>B<br>A | B<br>A | A |
←─ FIG.5b ←─ FIG.5c ←─ FIG.5d ←─ FIG.5e
FIG. 5a (PRIOR ART)
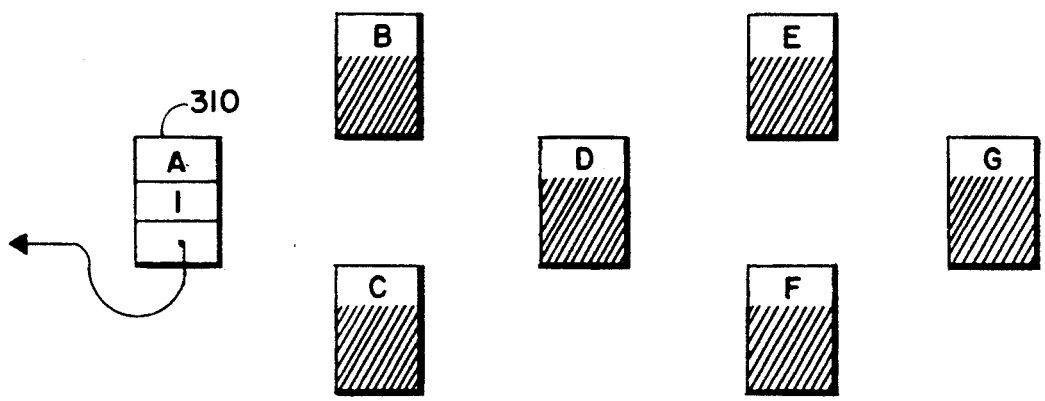
FIG. 5b (PRIOR ART)
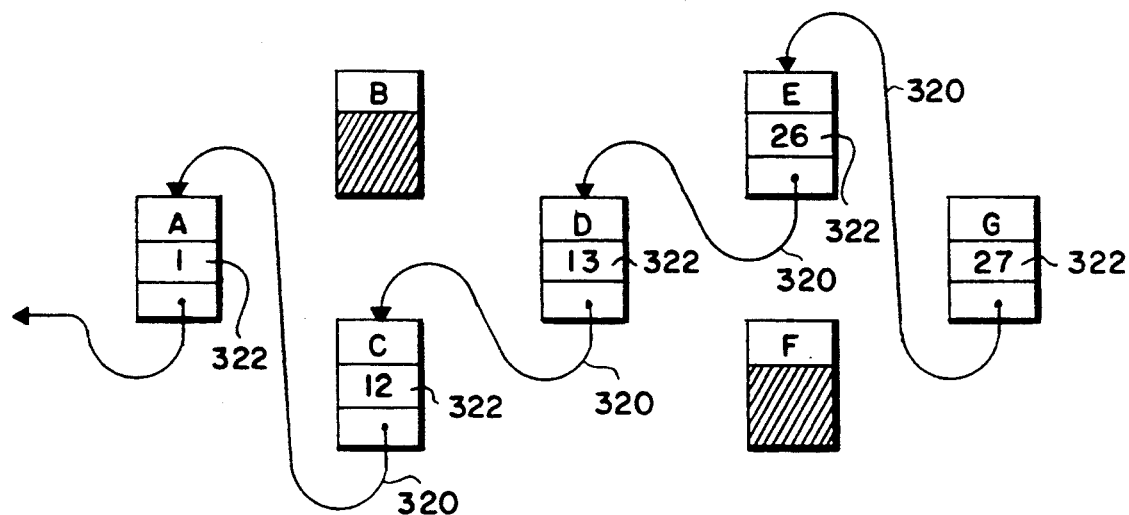
FIG. 5c (PRIOR ART)

```
struct time       { int phase;  int offset; };         /* a clock */
struct device     {
    int                 delay;          /* time delay through device */
    struct node       * drain;  /* the consumer / successor nodes */
    logical             is_clocked;     /* is this a clocked device? */
    struct transition * clocks_head;    /* linked list of clocks */
};

ROUTINE dfs_visit
    { struct node         * node           /* the current node      */
    , struct time         * clock          /* the current arrival time */
    , struct transition   * predecessor    /* the driving transition   */
    }
{
    struct device       * device;
    struct time           latch_clock ;
    struct successor    * successor;
    struct transition   * new_trans ; =
        SEARCH node->transitions_head FOR transition with same phase;

/* if there is no previous transition, or this visit is a
    ** new worst case, then update the transition */
    if { new_trans == NIL  OR  new_trans->time < clock }   {
        new_trans : = ALLOCATE   { struct transition } ;
        new_trans->node              : = node;
        new_trans->clock             : = clock;
        new_trans->predecessor       : = predecessor;
        link new_trans ONTO LINKED_LIST node->transitions_head;

FOREACH device IN node->successor_head DO  {
            IF { device->is_clocked }     {
                FOREACH latch_clock IN device->clocks     {
                    IF{ clock < latch_clock->opening_time }     {
                        RETURN;
                    ELSE {
                        IF { clock > latch_clock->closin_time }
                            CALL report_timing_violation { device, node };
                        FOREACH successor IN device ->drain DO
                            CALL dfs_visit{successor,clock+device->delay, new_trans } ;
                    }
                }
            } ELSE {
                /* walk the list of nodes draining the device. */
                FOREACH successor IN device->drain DO
                    CALL dfs_visit { successor, clock+device->delay, new_trans } ;
            }
        }
    }
}
```

FIG.13

| STEP | 2 | 3 | 4 | ... | 10 | 11 | 12 | ... | 13 | 14 | 15 |
|---|---|---|---|---|---|---|---|---|---|---|---|
|  | $\phi_2+0$ | $\phi_2+5$ | $\phi_2+22$ |  | $\phi_1+1$ | $\phi_1+12$ | $\phi_1+29$ |  | $\phi_1+0$ | $\phi_1+7$ | $\phi_1+24$ |
|  | $\phi_5+0$ | $\phi_5+5$ | $\phi_5+22$ |  | $\phi_{10}+1$ | $\phi_{10}+12$ | $\phi_{10}+29$ |  | $\phi_5+0$ | $\phi_5+7$ | $\phi_5+24$ |
|  | $\phi_8+0$ | $\phi_8+5$ | $\phi_8+22$ |  |  |  |  |  | $\phi_{10}+0$ | $\phi_{10}+7$ | $\phi_{10}+24$ |
|  | $\phi_{11}+0$ | $\phi_{11}+5$ | $\phi_{11}+22$ |  |  |  |  |  |  |  |  |
| STACK | D | G | J |  | E | H | J |  | F | I | J |
|  | $\phi_{2F}$ | D | G |  | $Z_2$ | E | H |  |  | F | I |
|  |  | $\phi_{2F}$ | D |  |  | $Z_2$ | E |  |  |  | F |
|  |  |  | $\phi_{2F}$ |  |  |  | $Z_2$ |  |  |  |  |

FIG. 14a

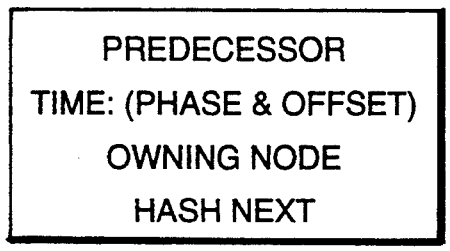
FIG. 17a  TRANSITION
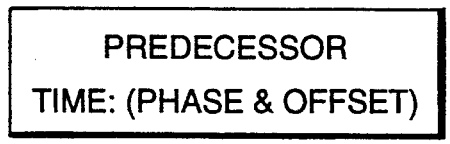
FIG. 17b  SMALL-TRANSITION
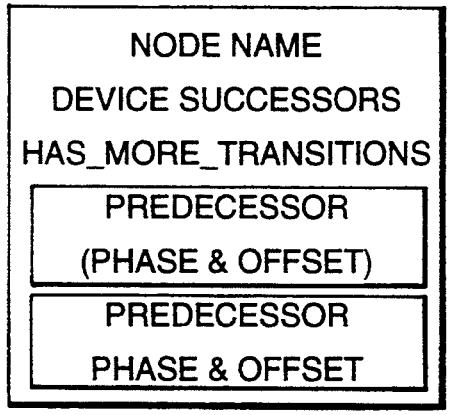
FIG. 17c.  NODE

STATIC TIMING VERIFICATION

BACKGROUND OF THE INVENTION

This invention relates to static analysis of integrated circuit designs.

Prototyping a VLSI (very large scale integrated circuit) design is extremely expensive: fabbing (fabricating) a pass of a prototype full-custom VLSI chip would take several months and would cost several hundred thousand dollars. If the chip design is flawed, the chip itself is almost impossible to probe to isolate the problem and determine corrections to the design. For this reason, virtually all VLSI chips are designed and thoroughly verified by software modelling before the first actual silicon is fabbed.

A timing verifier is one program in the suite of tools used by a VLSI designer. Timing verification is the process of analyzing the circuit model to ensure that the signals propagate through the logic quickly enough to meet the timing requirements at a specified clock frequency. (A timing verifier may also have bundled in other analyses, for instance for race conditions or other logic problems.) Once the circuit has been largely designed using other tools of the suite, the timing verifier is used to improve it, e.g., to eliminate bottlenecks that would force the circuit to be run at a slow clock frequency. The timing verifier takes as input a description of the circuit and its interconnections, the impedances and/or loading of the wires, specifications of the devices in the logic path, and descriptions of the clocked elements, and produces as its output timing of the slowest paths, i.e., the "critical paths", from which the designer can deduce the maximum clock frequency at which the circuit can be run. The designer can then redesign the critical paths to speed them up, thus speeding up the entire circuit. This process is typically iterative: the designer runs the timing verifier, and modifies his circuit design using the information generated. He repeats this process until the number of critical paths with the same timing limit is so large that reducing the time of all of them becomes impractical.

In a synchronous integrated circuit (IC) design, major signals captured in latches at clock edges and are held at stable values when and while the clock is deasserted. The value of the signal at the output of a latch, a latched signal, is only allowed to change during the time the clock signal is asserted. During the time the clock is asserted, changes on the D input to the latch immediately propagate through the latch to the Q output; thus the clock assertion is said to make the latch transparent. The latched signals propagate downstream through combinatorial logic to other latches. The timing verifier reports any latches (or other clocked element) whose inputs are not stable in time to meet the requirements of the latch's clock.

FIG. 1 depicts a simple illustrative circuit, which will be considered under a simplified model of timing constraints and design rules. Two input signals A 100 and B 102 are latched by latches 108 and 110. Thus, signals A' 112 and B' 114 are stable except when the two latches 108 and 110 are transparent, which occurs when clocks $Ck_A$ 104 and $Ck_B$ 106 are asserted. Once A' and B' have been latched, they remain stable, and combinatorial logic $CL_1$ 116, $CL_2$ 120, and $CL_3$ 122 compute signals Y 124 and Z 126. Each of $CL_1$, $CL_2$, and $CL_3$ impose a certain delay in this computation. The downstream part of the design (not shown) relies on Y 124 and Z 126 being latched by latches 132 and 134 on clocks $Ck_Y$ 128, and $Ck_Z$ 130. Thus, $CL_1$, $CL_2$, and $CL_3$ must be fast enough to meet the setup requirements of latches 132 and 134.

FIG. 2 presents a timing diagram for the circuit of FIG. 1. The first three lines show the clocks $Ck_A$ 104, $Ck_B$ 106, $Ck_Y$ 128, and $Ck_Z$ 130. In this example, A and B are latched on the same clock. Signals A and B must be stable far enough before the falling edge of $Ck_A/Ck_B$ 206 to accommodate a "setup time" 208, a characteristic of latches 108 and 110. Once latches 108 and 110 become transparent during $Ck_A/Ck_B$ 204, (assuming that the setup time and the data-to-output time of the latches are equal) signals A' and B' are allowed to transition until they are latched on the falling edge of $Ck_A/Ck_B$ 206. A' and B' drive $CL_1$, $CL_2$, and $CL_3$, which in turn produce signals X, Y, and Z. Under the simplified timing rules, the timing constraints of the circuit are satisfied if the propagation delay 208 of latch 108 plus the propagation delays through $CL_1$ 216 plus $CL_2$ 220 plus the setup time 232 of latch 132 is less than the time from the fall of clock $Ck_A/Ck_B$ to the fall of clock $Ck_Y$ 228, and if the propagation delay 208 of latch 110 plus the time delay through $CL_1$ 216 plus $CL_3$ 222 plus the setup time 234 of latch 134 is less than the time from the fall of clock $Ck_A/Ck_B$ to the fall of clock $Ck_Z$ 230. The paths of A'—$CL_2$—Y and B'—$CL_3$—Z must also meet the timing requirements of latches 132 and 134, but these will be trivially satisfied because they are clearly faster than paths A'—$CL_1$—X—$CL_2$—Y and B'—$CL_1$—X—$CL_3$—Z. When all these conditions are satisfied, the circuit is said to pass timing verification.

If the circuit fails timing verification, the timing verifier will report the critical paths that failed. Either the logic on the slow paths needs to be redesigned to be faster, or the clock frequency needs to be slowed down to accommodate the timing of the circuit.

Timing verifiers operate on one of two general paradigms: dynamic or static.

In dynamic timing verification, the circuit design is simulated through time. The engineer must determine model input stimuli with which to drive the circuit model, called test vectors. Applying dynamic timing verification to the sample circuit to FIG. 1, the timing verifier would successively apply twelve stimuli where either A or B or both undergo transitions: AB—>AB={00—>01, 00—>10, 00—>11, 01—>00, 01—>10, 01—>11, 10—>00, 10—>01, 10—>11, 11—>00, 11—>01, 11—>10 } and run a loop to simulate time, during which model clock $Ck_A/Ck_B$ would undergo several transitions. The circuit model would be operated through time to see at what time signals Y and Z stabilize. Dynamic timing verification is effective in that it is capable of diagnosing all timing problems, at least for the test vectors applied. But in modern circuit designs, the super-exponential combinatorics on tens of thousands of signals is fatal to the dynamic approach: there simply isn't time to test all possible combinations of inputs (most of which would never arise in actual operation), nor for a human to filter out a set of meaningful test vectors that will test all the effective paths.

In the second paradigm, static analysis, there is no loop simulating the passage of time. Static analysis is to dynamic analysis as theorem proving is to case analysis: instead of attempting to simulate a "large enough" number of specific cases, a static timing verifier "reasons" about the circuit model and draws inferences about whether the circuit will meet its timing constraints. This generally involves analyzing every node—i.e., every wire—in a circuit and calculating transition times based on the arrival time of inputs and the propagation delay through the structures. As the times of the transitions of the inputs to a node are analyzed, only the latest transition (in time) is saved, and the algorithm immediately stops tracing any path that is known not to be the worst case. This process, called information pruning, is required to keep the execution times reasonable.

One known algorithm for static timing verification is a depth-first search (DFS) of the circuit starting at each signal guaranteed on a clock edge, labelling each node with the currently best-locally-known worst-case timing information. After all nodes have been labelled, a second pass examines all timing constraints to tell the designer whether the circuit as a whole meets its timing constraints.

Consider the circuit of FIG. 3, in which a first stage of the circuit has two paths of different delay times, which join at a multiplexer. The output of the multiplexer fans out in a second stage of two paths of different delay times, which are joined at a second multiplexer. The DFS algorithm represents each node of a circuit by a data structure as shown in FIG. 4. The node has a name, a "worst case arrival time," and a pointer to the node that drove this worst-case transition.

FIGS. 5a–e depict a DFS analysis of the circuit of FIG. 3: FIG. 5a shows a time-sequence of stack states, and FIGS. 5b–e show a time sequence of states of data structures.

In the DFS algorithm, the graph of the nodes of the circuit is walked in a depth-first order. The algorithm's walker maintains a "current arrival time," and a stack of nodes. (Since this is a static analyzer, note that the arrival time does not "tick" off time incrementally, it moves forward and back by the discrete amounts of delay of the logic walked.) The DFS walker pushes nodes onto the stack as it traces paths downstream, and pops them as it unwinds back upstream. The walker increments its arrival time as it walks downstream through logic by the time delay of the logic, and decrements it the same amount as it unwinds back. As the algorithm pushes each node, if the walker's arrival time is later than the current "worst case arrival time" (or simply ".time") of the node, then the node is updated with the value of the DFS arrival time, and the node's "worst case predecessor" (or simply ".predecessor") is pointed at the predecessor node down which the DFS walk came, and the DFS continues down the successor nodes. If the DFS arrival time is equal to or earlier than the current node's worst case arrival time, the probe of this path is abandoned, and the node is popped off the stack.

In FIG. 5a, each column depicts a step 300 identified by number, and the value of the DFS arrival time 302 during that step. The state of the DFS stack 304 is also shown, with the top of the stack in bold. The term "labelled" is used to describe information permanently (though overwritably) stored in the representation of the circuit. "Unvisited" is used in a local sense: a node is unvisited if it as not been visited via the current path, even if it has been previously visited via a different path.

step 1: FIG. 5b shows the configuration of the nodes for the circuit of FIG. 3 as the algorithm visits the first node of the circuit, node A 310. All the node names have been filled in. A.predecessor and A.time have been filled in (by the process about to be described in detail).

step 2: Assume that A's list of successor nodes is ordered such that the algorithm visits C, then B. Thus, the algorithm walks to node C. Since the logic connecting A to C, $CL_2$, consumes 11 ns, the DFS algorithm carries the arrival time 12 as it arrives at C. The algorithm, finding C not already labelled, labels C.time with 12 and points C.predecessor to A.

step 3: The only successor of C is D, through logic consuming 1 ns, so the algorithm proceeds to D and sets D.time 13 and points D.predecessor to C. Assume that D's list of successor nodes is ordered such that the algorithm visits node E, then F.

step 4: Node E is filled in with time 26 and predecessor D.

step 5: Node G is filled in with time 29 and predecessor E. The walk would continue downstream from node G.

The intermediate state after step 5 is shown in FIG. 5c. The "worst-case arrival times" 322 have been filled in with a preliminary estimate of the latest transition time. The .predecessor pointers 320 show a preliminary estimate of the critical path to G, A—C—D—E—G. After the algorithm has visited all downstream logic and popped its stack to G:

step 6: DFS pops its stack to back E. E has no unvisited successors.

step 7: DFS pops its stack back to D. D has an unvisited successor, F.

step 8: Node F is filled in with time 32 and predecessor D.

step 9: When DFS arrives at node G with arrival time 33, it finds the node already labelled, but with a time earlier than the current DFS arrival time. Thus, G is updated with time 33, and G.predecessor is updated to point to node F. Note that pointing G.predecessor from E to F "prunes" from the graph all analysis downstream of E that was computed between steps 5 and 6. The algorithm has proved that E cannot possibly be on the critical path to G nor any node downstream of G. Because G has been relabelled, the nodes downstream of G must be walked again to have their times updated.

The intermediate state after step 9 is shown in FIG. 5d.

step 10: DFS pops its stack back to node F.

step 11: DFS pops its stack back to node D. D has no unvisited successors.

step 12: DFS pops its stack back to node C.

step 13: DFS pops its stack back to node A. The next unvisited successor of A is B.

step 14: B is labelled with time 8 and predecessor A.

step 15: DFS arrives at node D with arrival time 9. The arrival time is earlier than the current time of node D; thus, the algorithm stops probing along this path: all paths downstream of node D through node B are also said to be "pruned." By the same reasoning used in step 9, the algorithm has proved that the critical path to all nodes downstream of D must pass through C, not B.

step 16: DFS pops its stack back to node B.

step 17: DFS pops its stack back to node A. Node A now has no unvisited successors.

Finding no unvisited successors of A, the DFS algorithm is complete. The result of the algorithm is the critical path graph of FIG. 5e. For instance, the critical path to node G can be discovered by tracing the .predecessor pointers from a node; e.g., the critical path to G is seen to be A—C—D—F—G. The critical path graph will be of the form of a forest of trees, each tree rooted at one of the input nodes or interior latches. Paths B—D and E—G have been pruned; no larger path that would have used these paths will be analyzed.

There may be multiple critical path graphs built for a single circuit, for instance one for a rising clock edge and one for a falling edge. Each node will have at most a single out-edge pointing to the latest-transitioning driver node for the given clock edge (or to one of several equally-late transitioning). The critical path graphs superimpose without effect on each other. Without loss of generality, the disclosure will discuss single critical path graphs.

Once the timing verifier has identified the critical path to every node, the designer will redesign parts of the circuit to speed up the logic on the critical path, and then run the timing verifier again. If the designer successfully speeds up a structure on the critical path, subsequent runs of the timing verifier on the altered circuit will very likely produce a different critical path graph.

Pruning is essential to making static analysis practical. A naive DFS walk of a circuit would take time exponential in the number of edges between the nodes of the circuit. Though it is possible to construct artificial examples in which DFS algorithms, even with pruning, exhibit exponential time complexity, in practice pruning reduces the time complexity from exponential to nearly linear. With pruning, a single run of DFS and violation sorting of a full microprocessor design can take about fifteen CPU minutes. Without pruning, such analysis would be infeasible.

Static timing verifiers consider clocks as a distinct class of inputs from all other signals. Clocks are treated as independent variables—as the givens of the system. The times of all other signals are stated relative to the clock's phase boundaries.

Some systems have two (or more) subsystems operating at different frequencies, both derived by frequency dividing a single primary clock. For example, the frequency dividers 602 and 604 of FIG. 6 convert a 20 ns symmetric primary clock 600 into a fast 40 ns cycle time divided into four phases of clocks 610–613, and a slow 120 ns cycle time divided into three phases of clocks 620–622. The fast cycle has four phases, $\phi_{1F}$, $\phi_{2F}$, $\phi_{3F}$ and $\phi_{4F}$, with each of the four phases asserted for 10 ns. The slow cycle has three phases, $\phi_{1S}$, $\phi_{2S}$ and $\phi_{3S}$, each phase asserted for 40 ns. The fast cycle might be used in the fast-executing CPU core while the slow cycle might be used in peripheral bus operations.

Known timing verifiers analyze systems relative to a single synchronous clock. FIG. 7 shows a timing diagram in the frame of reference in which these known timing verifiers analyze the circuit of FIG. 8 when the circuit is clocked by the clocks generated in FIG. 6. In this circuit, latch $L_1$ drives combinatorial logic $CL_1$, which in turn drives latch $L_2$. Latches $L_1$ and $L_2$ are clocked by a signal derived by ANDing selected clock pulses of FIG. 6. Input signal A just meets the setup time requirements of latch $L_1$, which is transparent when $Z_1 = \phi_{4F} \phi_{1S}$ is asserted. Thus, B must be assumed unstable during $Z_1$. Because of the "single synchronous clock" constraint, the circuit must be analyzed relative to the fast $\phi_F$ clock, as shown in FIG. 7. Node B is unstable 630 during the time that latch $L_1$ is transparent 632; in the four-phase $\phi_F$ system, this must be modelled as the time that clock $\phi_{4F}$ is asserted 634. Node C settles 10 ns later 636. In the four-phase system, latch $L_2$ must be modelled as transparent 638 during the time that clock $\phi_{1F}$ is asserted 640. In the four-phase system, C settles too late to satisfy the set-up time requirements of latch $L_2$, and thus the timing verifier reports a timing violation on $L_2$. Known timing verifiers do not represent the relationship between $Z_1$ and $Z_2$, and therefore do not discern the additional four phases' delay between them.

Known timing verifiers have had facilities by which a user can, within the previous four-phase system, describe particular paths as being "false paths"—i.e., paths that, for reasons known to the user, will never occur in practice. Once the path from $L_1$ to $L_2$ has been identified as a false path, the timing verifier can modify its pruning method and analyze the next-most-critical path. However, this introduces a failure-prone manual step. Even with this feature, the timing verifier spuriously reports the path from $L_1$ to $L_2$ as a failure. The engineer must analyze the report, and then add this failure to a list of known spurious failures to ignore. He may subsequently modify the circuit in such a way that a previously-reported and now-ignored failure becomes important. But the timing verifier does not discover or communicate the new urgency of the failure.

SUMMARY OF THE INVENTION

In general, in one aspect, the invention provides a method for static analysis of a software model of a circuit clocked by two clocks where the two clocks' periods are multiples of a greatest common divisor (GCD) period. In the invention, a composite clock is determined with a period equal to the least common multiple (LCM) of the periods of the two clocks, and the model is statically analyzed relative to the composite clock.

(The definitions of the functions GCD and LCM have been extended beyond the integer domain on which they are commonly defined. The GCD of two real numbers x and y is the largest positive real z for which there exist integers i and j such that $i \times z = x$ and $j \times z = y$. The LCM of two real numbers x and y is the smallest positive real z for which there exist integers i and j such that $i \times x = z$ and $j \times y = z$. Note that if i and j do not exist, then the GCD and LCM is not defined on the pair. For instance, there is neither a GCD nor LCM of 2 and $\pi$.)

The invention provides the following advantages. A timing verifier incorporating the invention will report fewer false timing violations; thus the timing violations that are reported are more trustworthy, and therefore more fully analyzed. The invention reduces the amount of manual annotation of the model that a user is required to supply to a static timing verifier.

In a second aspect, the invention features a method of compressing virtual memory consumption for data structures in the case where an instantiation of a second data structure owns a variable plurality of instantiations of a first data structure. In the invention, full and small variants of the first data structure are declared, and an array of the small variant of the first data structure is embedded in the second data structure. Means are provided by which a computer program having an instantiation the second data structure can access all instantiations of the first data structure owned by the second data structure.

Other advantages and features of the invention will become apparent from the following description and from the claims.

DESCRIPTION

FIG. 4 is a data structure diagram.

FIGS. 5a-5e illustrate a time sequence of states during timing verification.

FIG. 13 is a pseudocode description of a timing verifier.

FIGS. 14a-14d illustrate a time sequence of states during the execution of a timing verifier.

FIGS. 17a-17c are data structure diagrams.

The invention has been implemented as part of NTV, a timing verifier in use at Digital Equipment Corporation. NTV is written in the C language.

Figure 1:
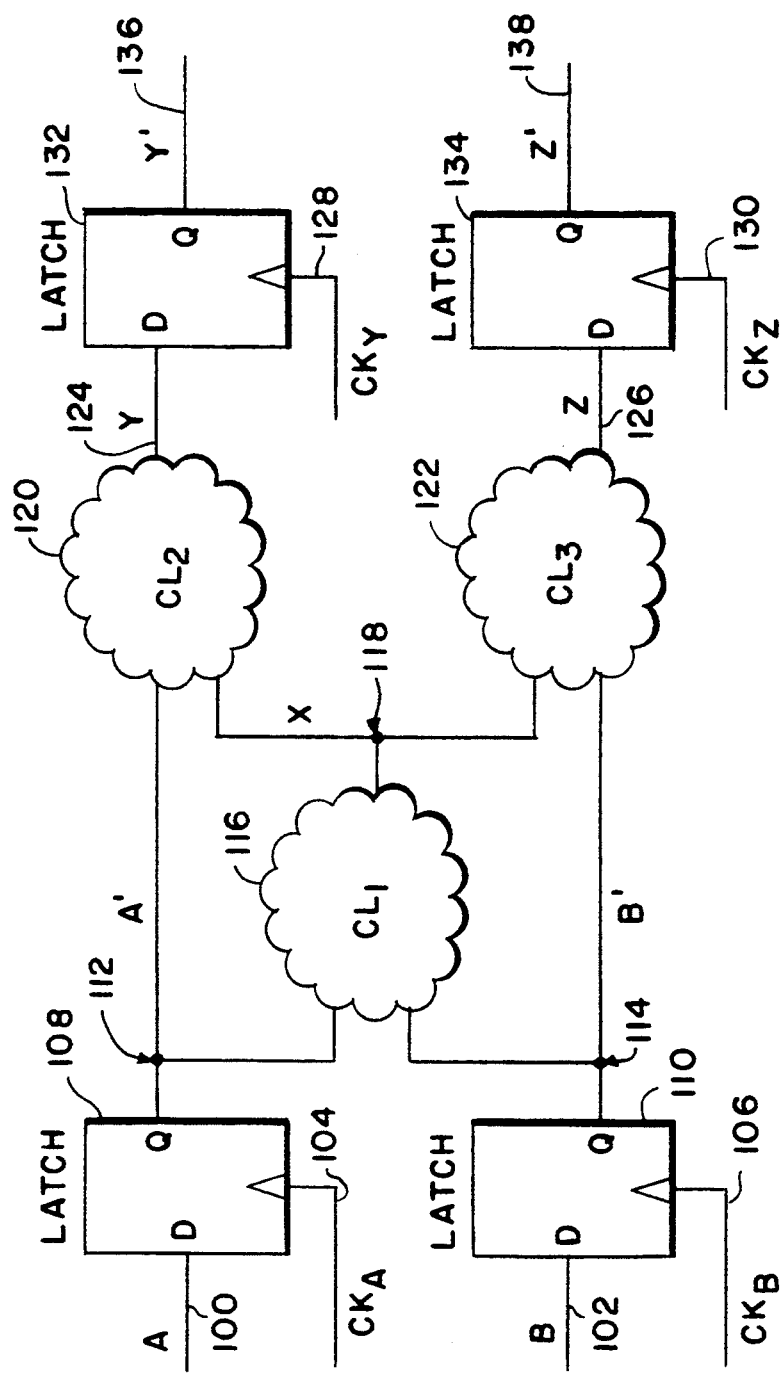
FIG. 1 is a schematic diagram of a hypothetical circuit.
Figure 2:
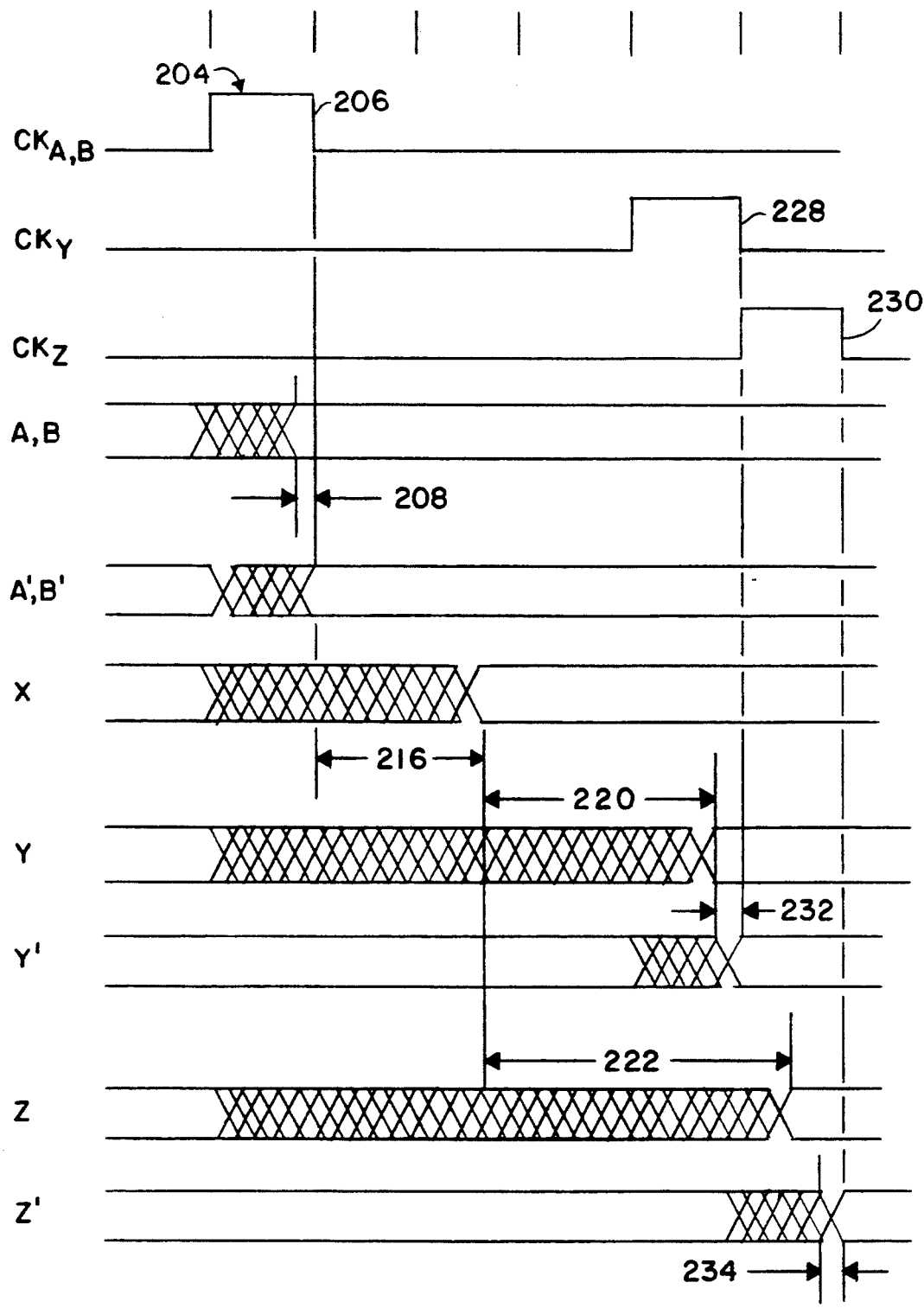
FIG. 2 is a timing diagram for the circuit of FIG. 1.
Figure 3:
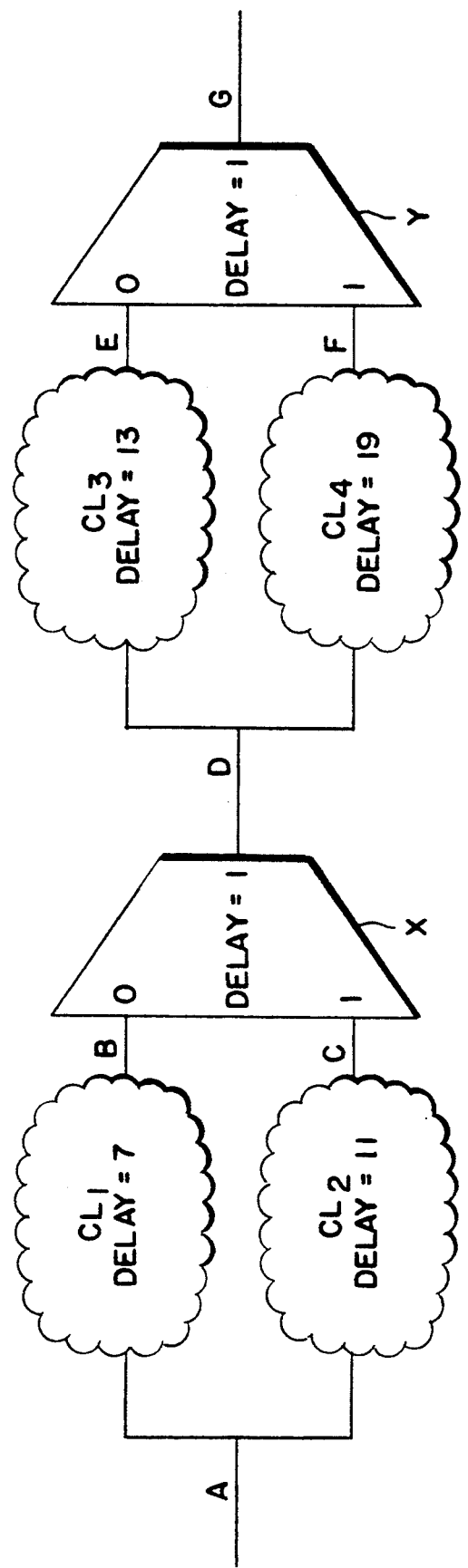
FIG. 3 is a schematic diagram of a hypothetical circuit.
Figure 5D:
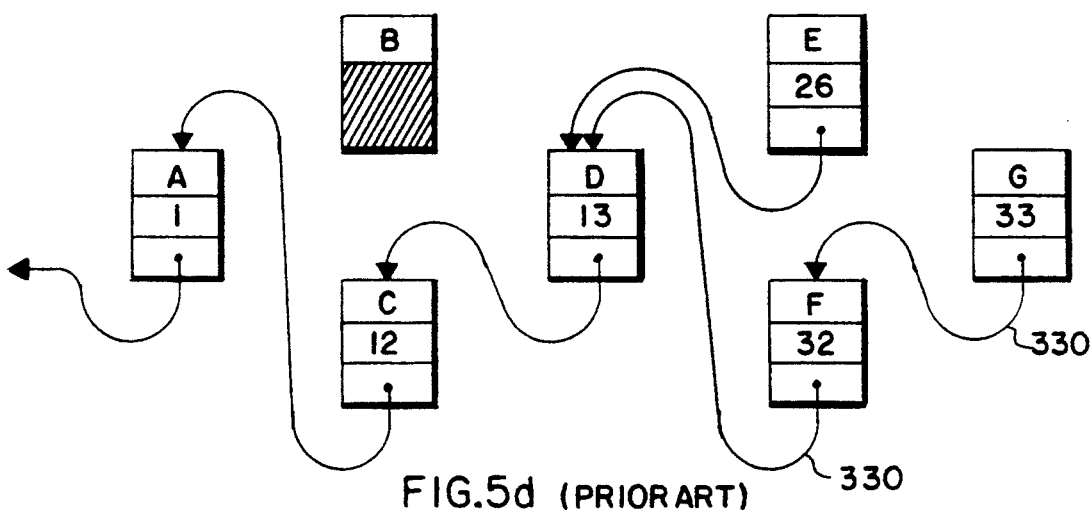
Figure 5E:
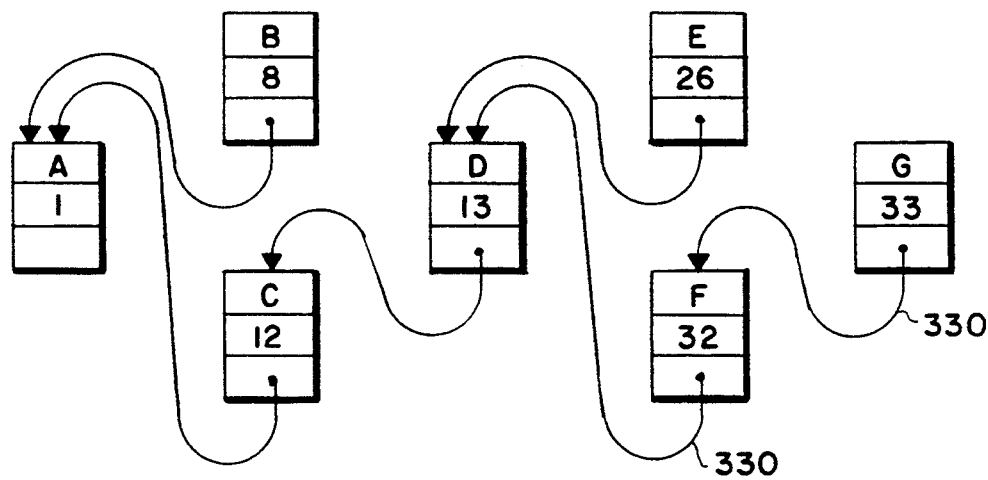
Figure 6:
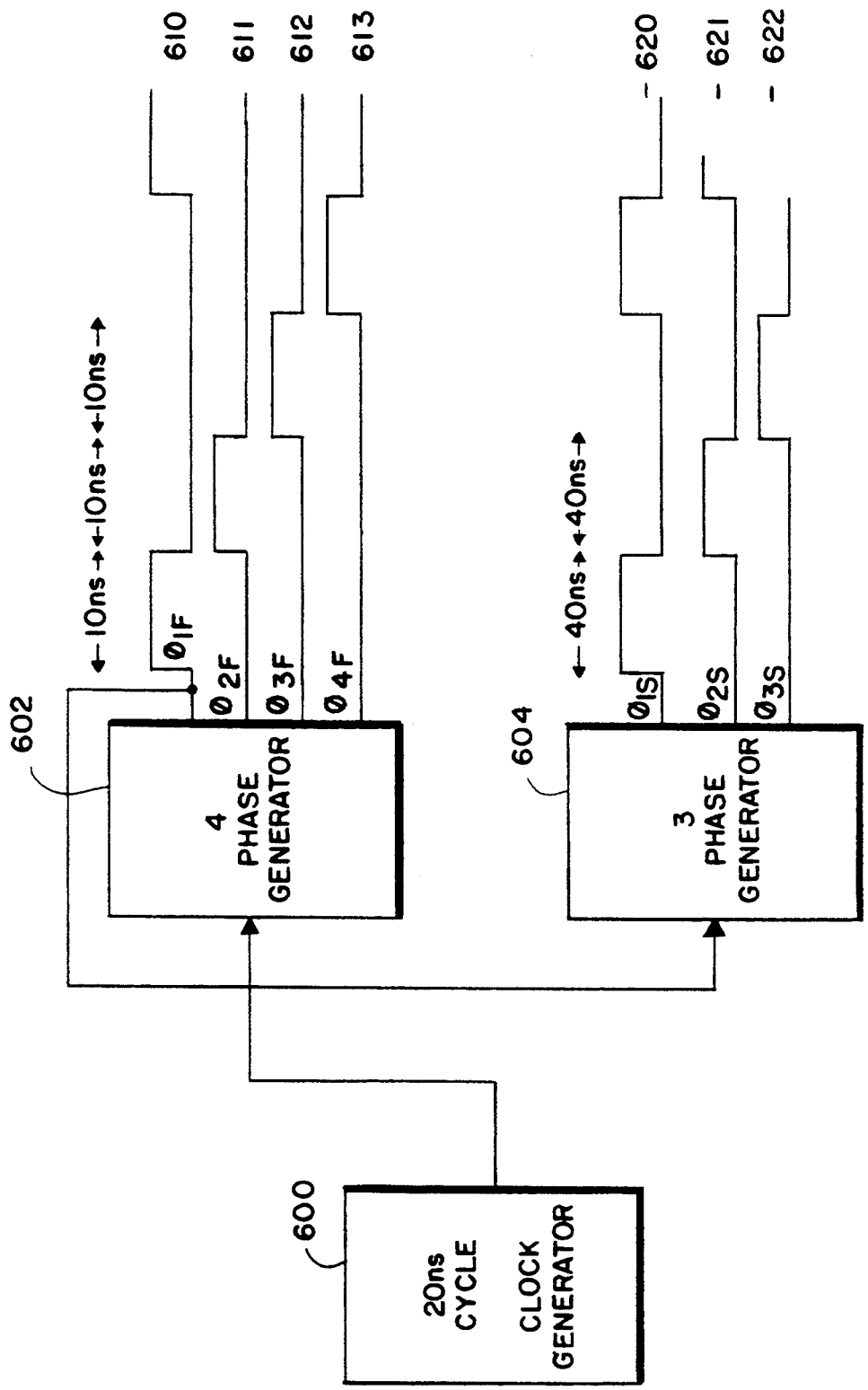
FIG. 6 is a block diagram of a frequency divider.
Figure 8:
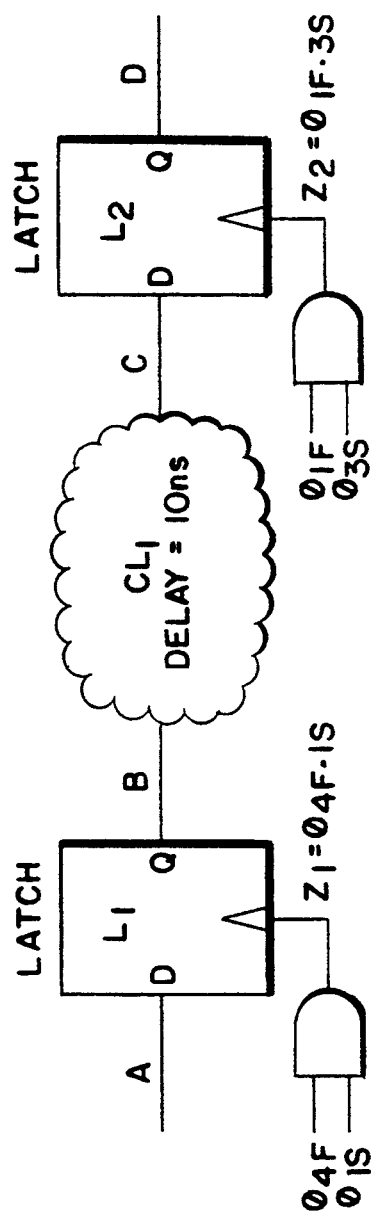
FIG. 8 is a schematic diagram of a hypothetical circuit.

A static timing verifier using the invention analyzes circuits with multiple clocks relative to a composite clock and computing timing information relative to that composite clock. For instance, in the circuit of FIG. 8 clocked by the clocks of FIG. 6, the least common multiple (LCM) period of the 40 ns $\phi_F$ fast clock 610–613 and 120 ns $\phi_S$ slow clock 620–622 is 120 ns. The timing verifier uses this LCM period as the cycle time of the composite clock. The phase width of the composite clock is the greatest common divisor (GCD) of the phase width time of two original clocks, in this case 10 ns. The twelve phases of the composite clock are named $\phi_1, \phi_2, \ldots \phi_{12}$. The clocks of FIG. 6 are plotted against the composite clock in FIG. 9.

Timing verifiers require users to specify the clock signals driving the circuit. To use the invention in NTV, the user specifies the characteristics of the composite clocking system. In the example of the previous paragraph, the user would specify a composite clock of twelve phases of 10 ns each. From this point, NTV performs the rest of the analysis automatically.

The timing verifier then statically analyzes the circuit with respect to the twelve 10 ns phase boundaries of the composite clock. The fast four-phase $\phi_F$ and slow three-phase $\phi_S$ clocks are considered as input signals to the circuit rather than as clocks. The edges of the $\phi_F$ and $\phi_S$ clocks are specified relative to the phase boundaries of the composite clock.

Figure 7:
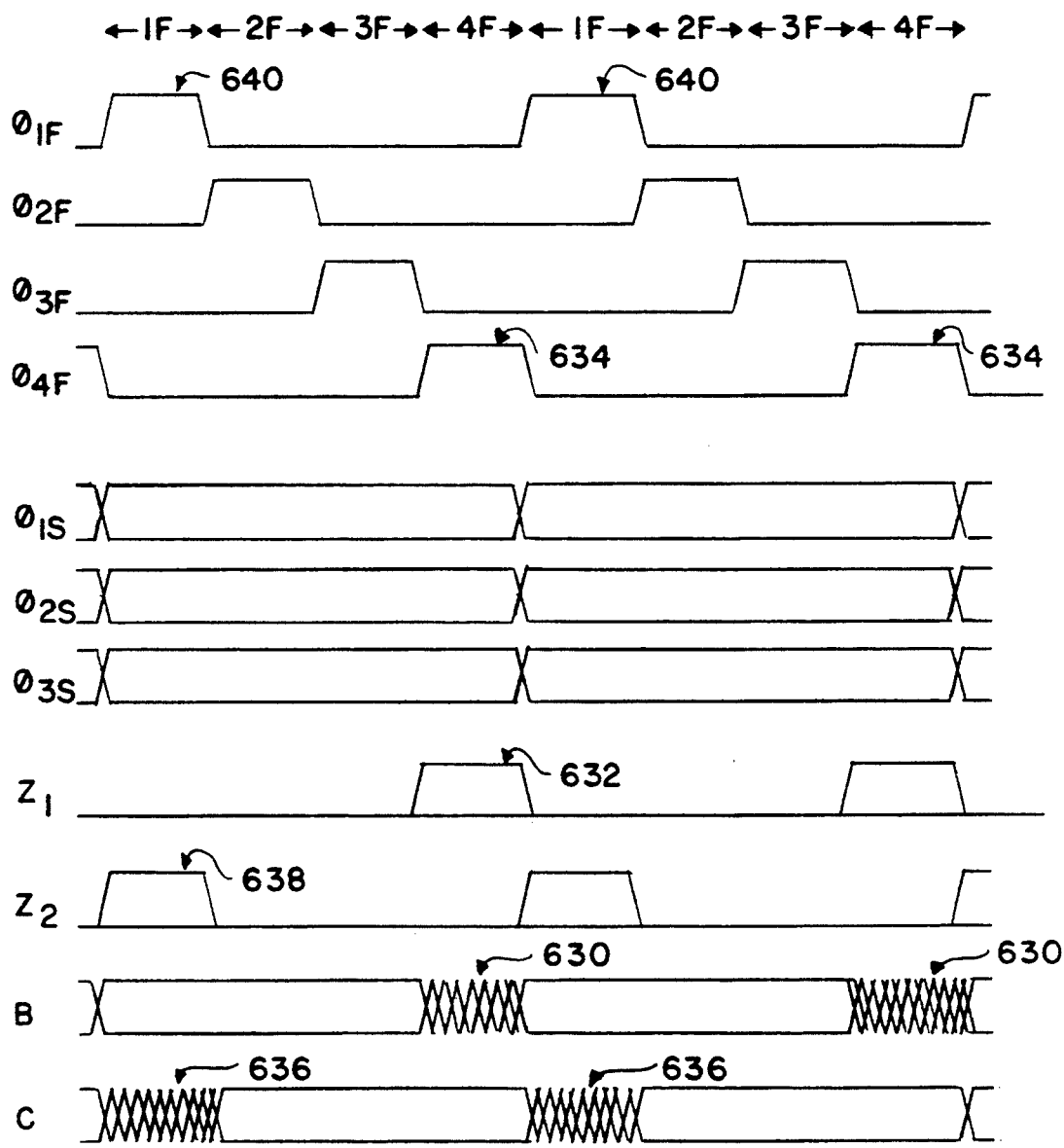
FIG. 7 is a timing diagram for the circuit of FIG. 8 as analyzed by a timing verifier.
Figure 9:
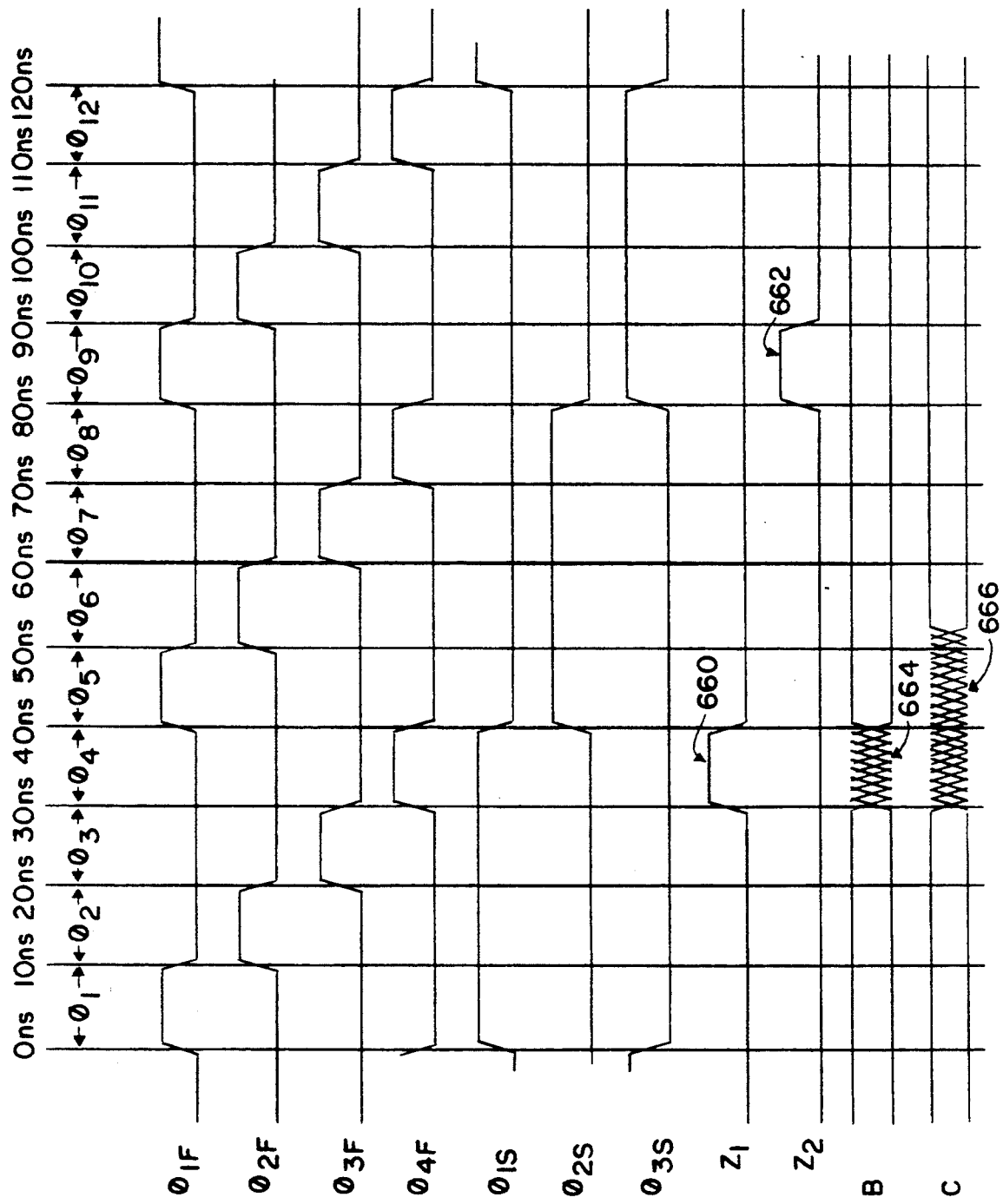
FIG. 9 is a timing diagram for the circuit of FIG. 8.

With this change of perspective from the four-phase $\phi_F$ clock of FIG. 7 to the twelve-phase composite clock of FIG. 9, $Z_1$ 660 and $Z_2$ 662 are both made non-conditional. Latch $L_1$ is transparent during the time $Z_1$ is asserted 660, which can be accurately modelled as $\phi_4$. In the four-phase system, B was unstable during $\phi_{1F}$, in the twelve-phase system, it is correctly seen to be unstable 664 only during $\phi_4$. C settles at the end of $\phi_5$ 666, satisfying the set-up time requirements of latch $L_2$, which is now more accurately modelled as only being transparent during $\phi_9$ 662.

Introducing this feature into a static timing verifier requires changing a few of the foundation assumptions on which the verifier is built, and implementing code modifications throughout the verifier to account for these changed assumptions.

Past static timing verifiers have been constrained to model latches that are transparent exactly once during a clock cycle. In timing verifiers using the invention, some latches will be transparent once per clock cycle, some several times.

Figure 10:
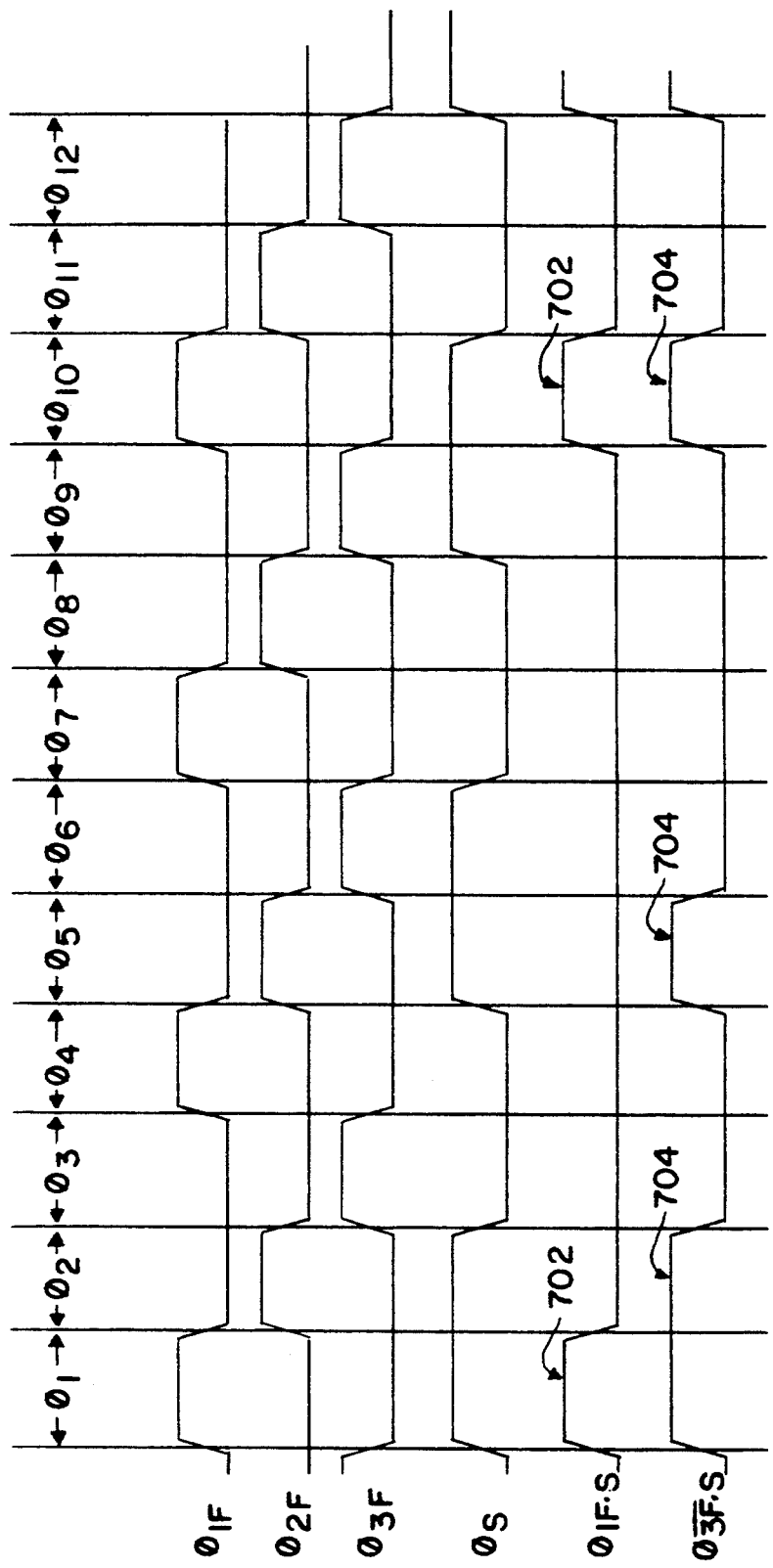
FIG. 10 is a timing diagram of a multiple clock system with multiple derived clocks.
Figure 11:
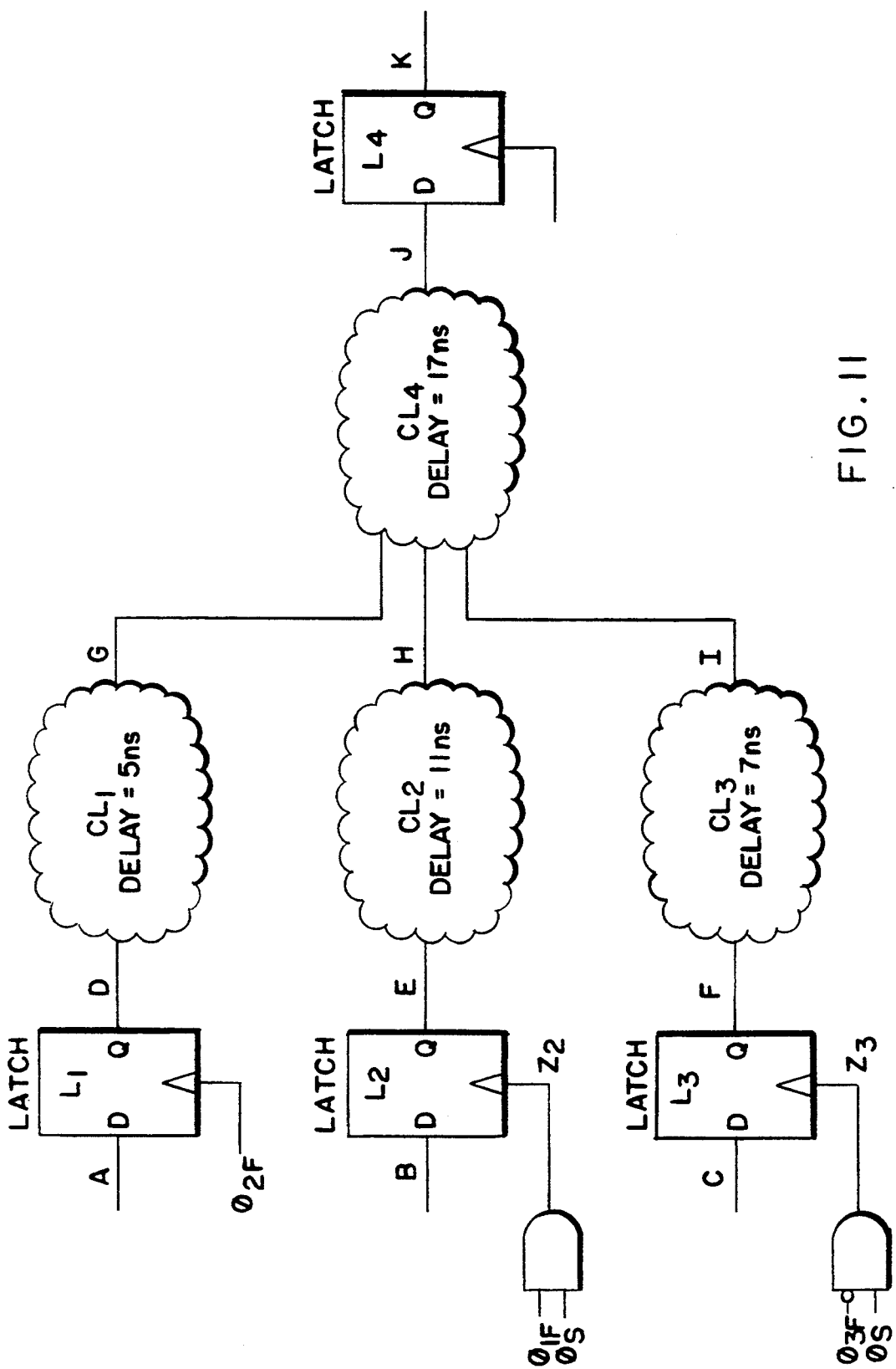
FIG. 11 is a schematic diagram of a hypothetical circuit driven by the clocks of FIG. 10.

Referring to FIGS. 10 and 11, another two clock system has a fast three-phase 30 ns clock with phases $\phi_{1F}, \phi_{2F}$ and $\phi_{3F}$ with phase width 10 ns, and a single 40 ns symmetric clock $\phi_S$. The GCD of these two clocks is 10 ns, and the LCM of the periods is 120 ns, giving a phase width for the composite clock of 10 ns and a cycle time of 120 ns. The twelve phases within the cycle of the composite clock are denoted $\phi_1, \phi_2, \ldots \phi_{12}$.

The circuit of FIG. 11 has a latch $L_1$ clocked by $\phi_{2F}$, another latch $L_2$ clocked by $\phi_{1F.S}$, and a third latch $L_3$ clocked by $\phi_{/3F.S}$. These three clocks are plotted against the composite twelve-phase clock in FIG. 10. Relative to the composite clock, latch $L_1$ becomes transparent four times per clock cycle on phases $\phi_2, \phi_5, \phi_8$ and $\phi_{11}$, latch $L_2$ becomes transparent twice per clock cycle on phases $\phi_1$ and $\phi_{10}$ 702, and latch $L_3$ becomes transparent three times per clock cycle on phases $\phi_1-\phi_2, \phi_5$ and $\phi_{10}$ 704. Therefore, nodes D, E, F, G, H, I and J and the nodes internal to combinatorial logic $CL_{1-4}$ may undergo transitions multiple times per clock cycle of the composite clock.

In NTV, the "worst case time" and "worst case predecessor" are de-embedded from the node proper into a "transition" data structure, so that a node may be labelled by a linked list of multiple transitions. Each transition data structure has a pointer back to the "owning" node (indicated by the name of the node in parentheses), and the worst-case time and predecessor for the transition. The time of each transition is expressed as a (phase boundary, offset relative to the phase boundary) ordered pair. No two transitions of a single node are relative to the same clock phase boundary—the earlier one is pruned out of the graph.

The DFS makes multiple passes over the circuit, each relative to a relevant clock phase boundary of the composite clock. (A phase boundary is relevant if a node's latest possible transition time is measured, directly or indirectly, relative to that boundary.) The DFS arrival time is computed by adding the time delay of the logic last walked through to the time of the transition of the node in the next-to-top slot of the stack.

Somewhat simplified (to remove fields for other NTV features not related to the invention), the data structures of the NTV implementation of the invention are presented in the following tables. Table 1 is the "transition" data structure, table 2 is the "node" data structure.

TABLE 1

The transition data structure

```
struct transition {
    struct node        *node;           /* Node that the transition is on */
    int                phase;           /* The phase referent this xition */
    int                arrival_time;    /* the time stamp. */
    struct transition  *predecessor;    /* latest-transitioning driver */
    struct transition  *next;           /* Next transition for "node" */
};
```

Figure 12A:
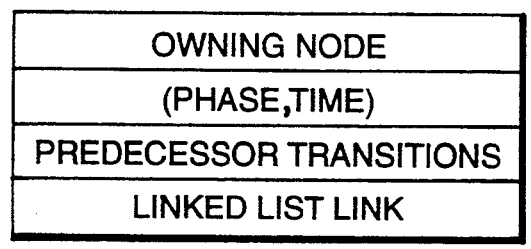
FIGS. 12a and 12b are data structure diagrams.

Member "node" indicates that the struct transition is owned by the appropriate "struct node" (see table 2). Members "phase" and "arrival_time" form the (phase, offset) to label the "worst case transition time." Member "predecessor" is the "worst case predecessor," and points to the latest-transitioning "struct transition" driving "node." Member "next" threads the linked list of "struct transitions" on the node. See also FIG. 12a.

TABLE 2

The node data structure:

```
struct node {
    struct name        *node_name;          /* name of the node */
    struct device      *successors_head;    /* list of consumer dev's */
    struct transition  *transitions_head;   /* list of transitions */
}
```

Figure 12B:
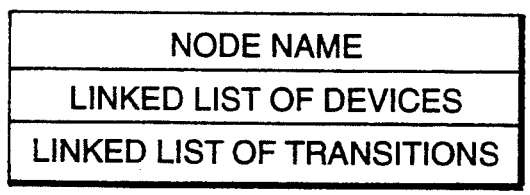

Member "node_name" is a pointer to a string naming the node. Member "successors_head" is the head of the linked list of the devices driven by the node. The devices, in turn, will point to the nodes immediately downstream of the node. Member "transitions_head" is the head of the linked list of transitions owned by the node. See also FIG. 12b.

Referring to FIG. 13, the algorithm runs in three parts, the first two of which run as coroutines. The first part, implemented in the statements indicted by reference 750, is to label the nodes of the circuit model with worst-case time/predecessor transition data structures, analogous to the DFS walk of the timing verifiers of the background. The second part, implemented in the statements indicted by reference 752, serves as the termination condition for the DFS of the first part: when the DFS arrives at a latch or other clocked element, part two checks that all inputs to the latch meet the clocks' timing constraints. If the signal arrives before the latch opens, then the path need not be traced any further. The third part runs after the entire circuit has been labelled; the input nodes to all devices that have timing constraints are examined, and those that do not meet the timing constraints are reported, as in the prior art.

The base case for DFS' recursion is a "primary input node," the nodes at the "left edge" of a circuit. The user must specify timing information for these primary input nodes.

In NTV, the circuit's actual clock signals, for instance $\phi_F$ and $\phi_S$, are primary input nodes. The timing of the clocks is known to the designer at the clock generators/frequency dividers, and is specified relative to the phase boundaries of the "mathematically ideal" clock, for instance $\phi_1$–$\phi_{12}$. The timing verifier propagates the clock signals through the clock logic of the circuit, applying the appropriate delay relative to a phase boundary at each of the clock buffers.

Figure 14B:
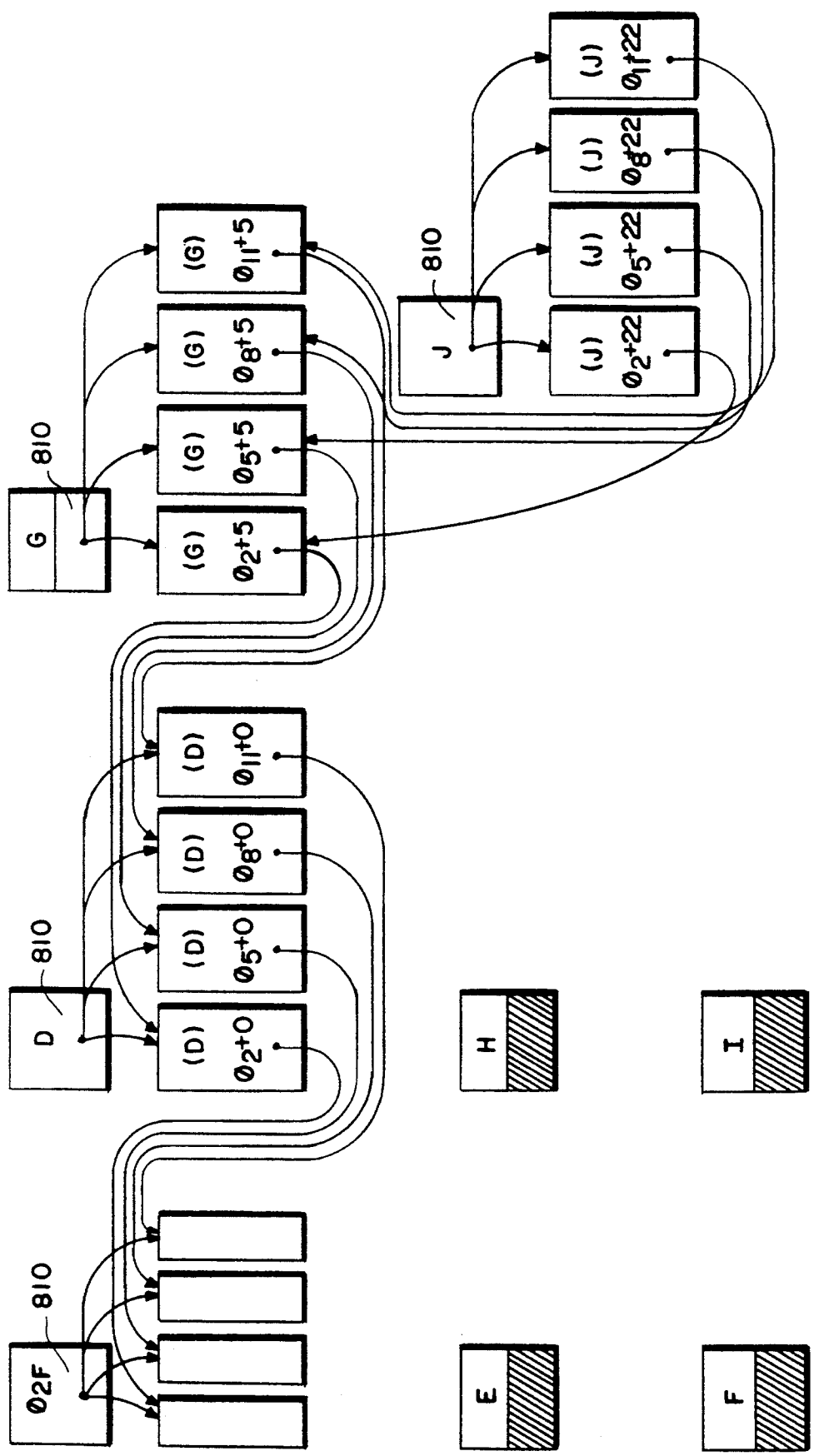
Figure 14C:
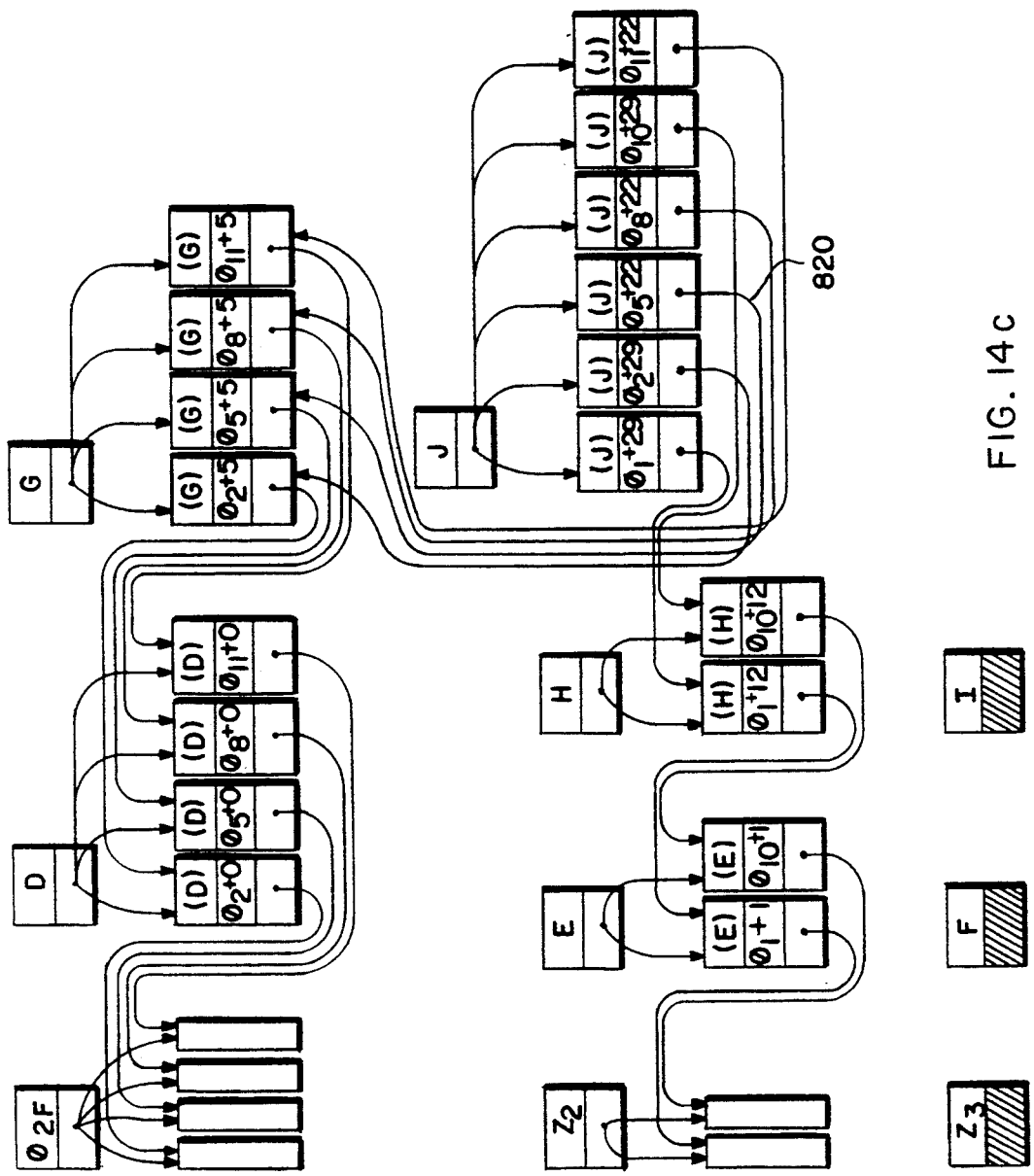
Figure 14D:
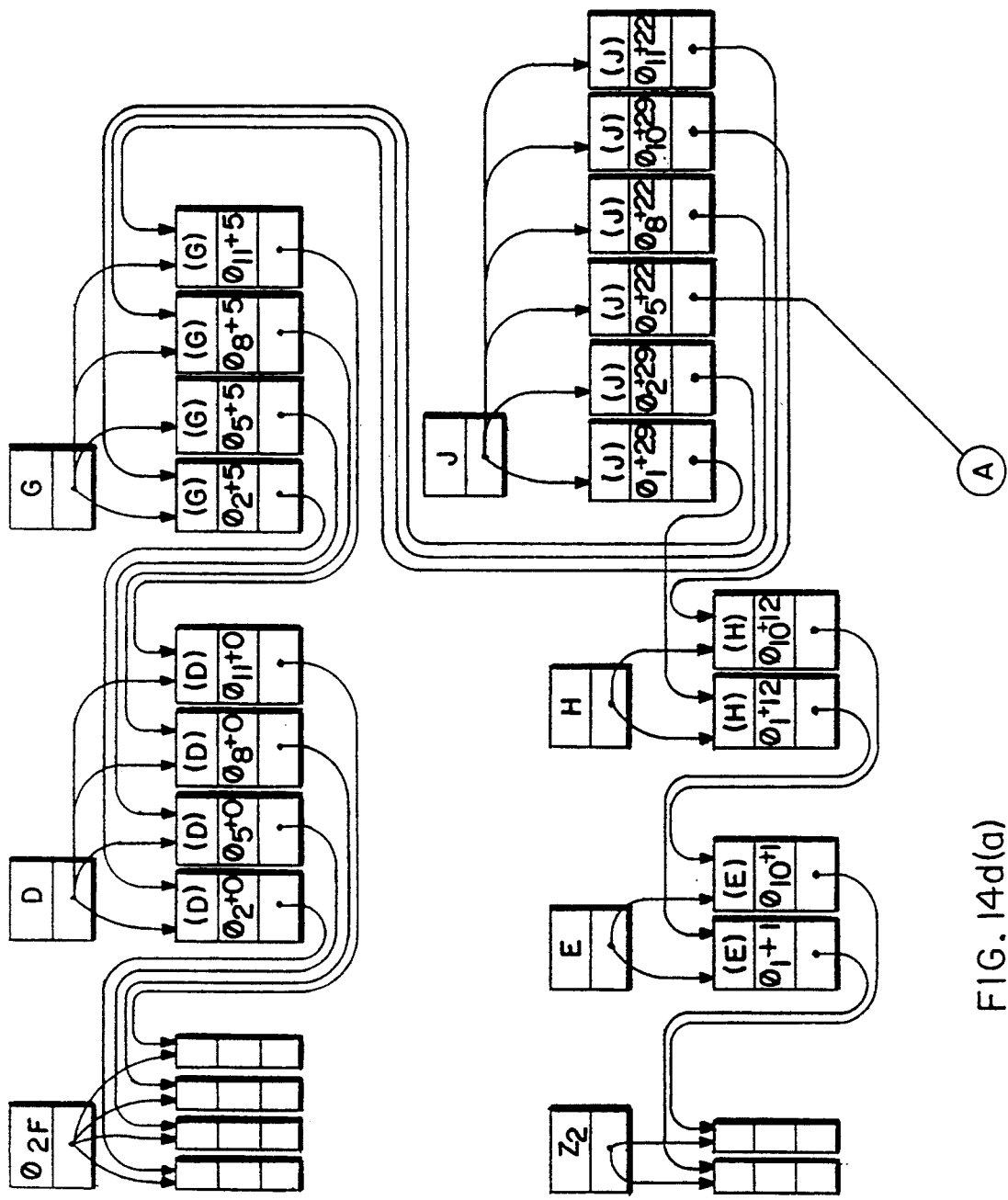
Figure 14D:
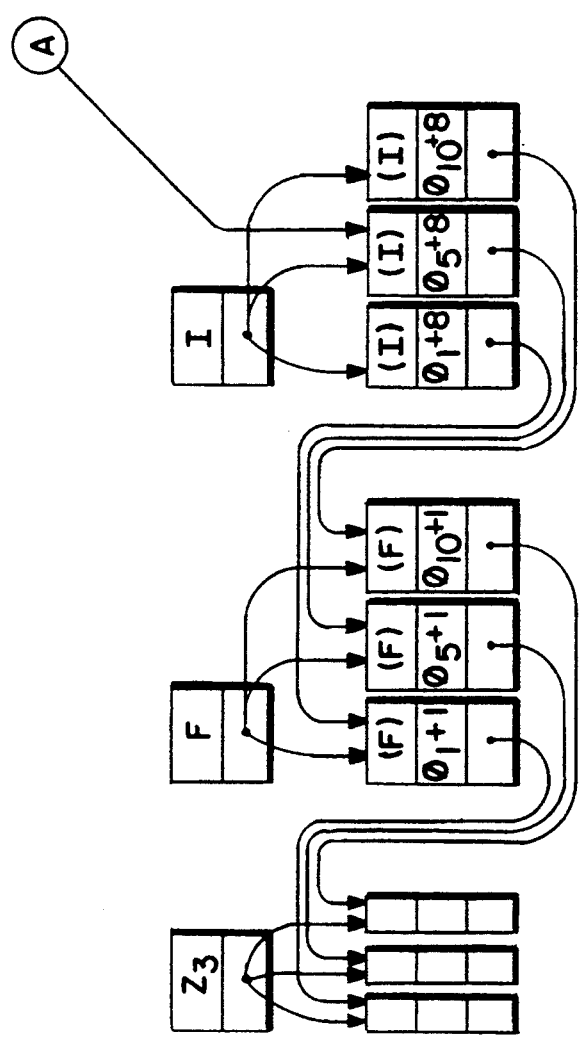

Part one runs as multiple passes, one pass for each transition on each primary input node. The following discussion of the part one DFS walk of the circuit of FIG. 11, diagrammed in FIGS. 14a–14d, discusses each of the several walks in parallel. FIG. 14a shows a time sequence of stack states, and FIGS. 14b–14d show snapshots of data structures as they are built.

step 1: The DFS walk will begin at one of the primary input nodes, in this case node $\phi_{2F}$. The four transitions clocking latch $L_1$ were specified by the user to occur at times $\phi_2+0$, $\phi_5+0$, $\phi_8+0$, and $\phi_{11}+0$. Assume the clock-to-data delay of the latches is zero.

step 2: The DFS walk will arrive at node D, labelling it with transition data structures for the four latest-possible transition times during each cycle of the composite clock. Latch $L_1$ closes at the falling edges of $\phi_{2F}$. In the composite clock, these events occur at the four times $\phi_2+0$, $\phi_5+0$, $\phi_8+0$, and $\phi_{11}+0$. The predecessor pointers of D's transitions will be pointed to transition data structures for node A.

step 3: When the walker arrives at node G, it will be carrying the times that it had at the previous node, incremented by the delay of $CL_1$, 5 ns, giving $\phi_2+5$, $\phi_5+5$, $\phi_8+5$, and $\phi_{11}+5$. Each of these times will be associated with a transition of the critical path parent node in $CL_1$. Assume that each of $CL_{1-4}$ is one stage, and therefore the driving node is the node visible in FIG. 11. Since node G has no previous transition data structures, G will be labelled with four transition data structures with the four transition times and critical path parents $((\phi_2+5,D)$, $(\phi_5+5,D)$, $(\phi_8+5,D)$, $(\phi_{11}+5,D))$.

step 4: Similarly, node J will be labelled with the four transition data structures $((\phi_2+22,G)$, $(\phi_5+22,G)$, $(\phi_8+22,G)$, $(\phi_{11}+22,G))$.

FIG. 14b shows the configuration at the end of step 4. The linked lists of transitions for nodes D, G, and J are denoted by multi-headed arrows 810.

steps 5, 6, 7, and 8, not shown: The DFS unwinds back through node $\phi_{2F}$ by popping nodes J, G, D, and $\phi_{2F}$ off the stack.

step 9: Clocks $\phi_{1F}$ and $\phi_S$ are AND'ed together to form clock $Z_2$. Assume the AND gate has delay 1; therefore the transition times of $Z_2$ will be $\phi_1+1$ and $\phi_{10}+1$.

step 10: Node E will be labelled with its latest possible transition times and driving nodes, $(\phi_1+1,Z_2)$ and $(\phi_{10}+1,Z_2)$.

step 11: node H is labelled with ( $(\phi_1+12,E)$, $(\phi_{10}+12,E)$).

step 12: The DFS walker will arrive at node J carrying $(\phi_1+29,\phi_{10}+29)$. When the algorithm compares the times carried by the walker to the times previously labelling a node, the pair of transition times to compare are those whose base clock phase boundaries are equal. Thus, when the DFS walk arrives a J, a node previously labelled, it will find no previous $\phi_1$ nor $\phi_{10}$ transitions, so it will simply add transition data structures $((\phi_1+29,H)$, $(\phi_{10}+29,H))$. J at this point will be labelled $((\phi_1+29,H)$, $(\phi_2+22,G)$, $(\phi_5+22,G)$, $(\phi_8+22,G)$, $(\phi_{10}+29,H)$, $(\phi_{11}+22,G))$. The latest transitions will be kept and the critical path graph updated, and the earlier transitions pruned. Since there were no earlier transitions relative to the times carried by the walker, no edges will be pruned.

FIG. 14c shows the configuration at the end of step 12.

steps 13, 14, 15, and 16, not shown: The DFS unwinds back through node E by popping nodes J, H, and E off the stack.

step 17: Clocks $\phi_{3F}$ and $\phi_S$ are AND'ed together to form clock $Z_3$. The transition times of $Z_3$ will be $\phi_1+1$, $\phi_5+1$ and $\phi_{10}+1$.

step 18: The DFS walk will arrive at latch $L_3$, labelling F with $((\phi_1+1,C)$, $(\phi_5+1,C)$, $(\phi_{10}+1,C))$.

step 19: I is labelled $((\phi_1+8,F), (\phi_5+8,F), (\phi_{10}+8,F))$.

step 20: At node J, the DFS walker will be carrying times $(\phi_1+25, \phi_5+25, \phi_{10}+25)$. Comparing each of the clock times with the transition .times of J and updating with the latest in each case, J will be labelled $((\phi_1+29,H)$, $(\phi_2+22,G)$, $(\phi_5+25,I)$, $(\phi_8+22,G)$, $(\phi_{10}+29,H)$, $(\phi_{11}+22,G))$. The edges/-transitions corresponding to $(\phi_5+22,G)$ (820 in FIG. 14c), $(\phi_5+25,I)$, and $(\phi_{10}+25,I)$ will be pruned.

FIG. 14d shows the configuration at the end of step 20, and at the end of the first part of the algorithm.

When the DFS reaches a latch or other clocked device, part two of the algorithm forms the terminating condition for the walk: based on a comparison of the symbolic time of the transitions of the nodes driving the latch against the times of the opening and closing edges of the clock controlling the latch, part two decides whether to stop the DFS probe at the latch, or whether to continue tracing the path to logic downstream. The comparison is made by subtracting the phase number of the transition of the driving node from the phase number of the latch's clock, multiplying by the phase width, and taking the difference of the offsets of the node transition time and the DFS walker's arrival time. For instance, if one of the node's transition times is $(\phi_A+B)$, and the latch shutoff time (the time at which the input must stabilize to meet the setup time for the latch) for one of the latch's clocks is $(\phi_C+D)$, then the timing constraint of the latch is satisfied if $$(C-A+1).\text{phase\_width}+D-B> =0$$

The timing verifier compares each of the times of the nodes driving the latch against each of the deasserting-edge time labels of the clock node for latch $L_4$ to determine whether timing requirements were met. If a node driving a latch has m transition data structures, and the latch has n phase edge constraints, then NTV makes $m \times n$ of these comparisons Based on each comparison, the algorithm decides whether to trace the path further downstream. There are three possible outcomes to the comparison:

1) The driver node transition's .time is before the time that the latch will open. The DFS walk is terminated. The paths downstream of this latch will be traced when a new DFS probe begins at the latch, using the latch's clocks as the latest transitions.

2) The driver node transition's .time falls during the time that the latch is transparent. The propagation delay of the latch is added to the arrival time, and a new arrival time value is computed by shifting the time base to the clock phase controlling the latch and adjusting the offset value. The DFS walk continues downstream using the phase-adjusted times of the input transitions as a base.

3) The driver node transition's time is after the latch closes. NTV reports this as a timing violation, and continues tracing the path based from the input transitions.

In known timing verifiers, this comparison simply compared the transition's .time to the times of the edges opening and closing the latch. But in the composite clock system, the latch is transparent multiple times per cycle. A static timing verifier enforces worst-case constraints by tracing the latest possible transition times of the nodes. Analogously, the invention compares the input node's latest arrival time against all latch opening times, particularly including the earliest one (measured cyclically from the arrival time of the latch's input node), thus enforcing worst-case constraints.

Figure 15:
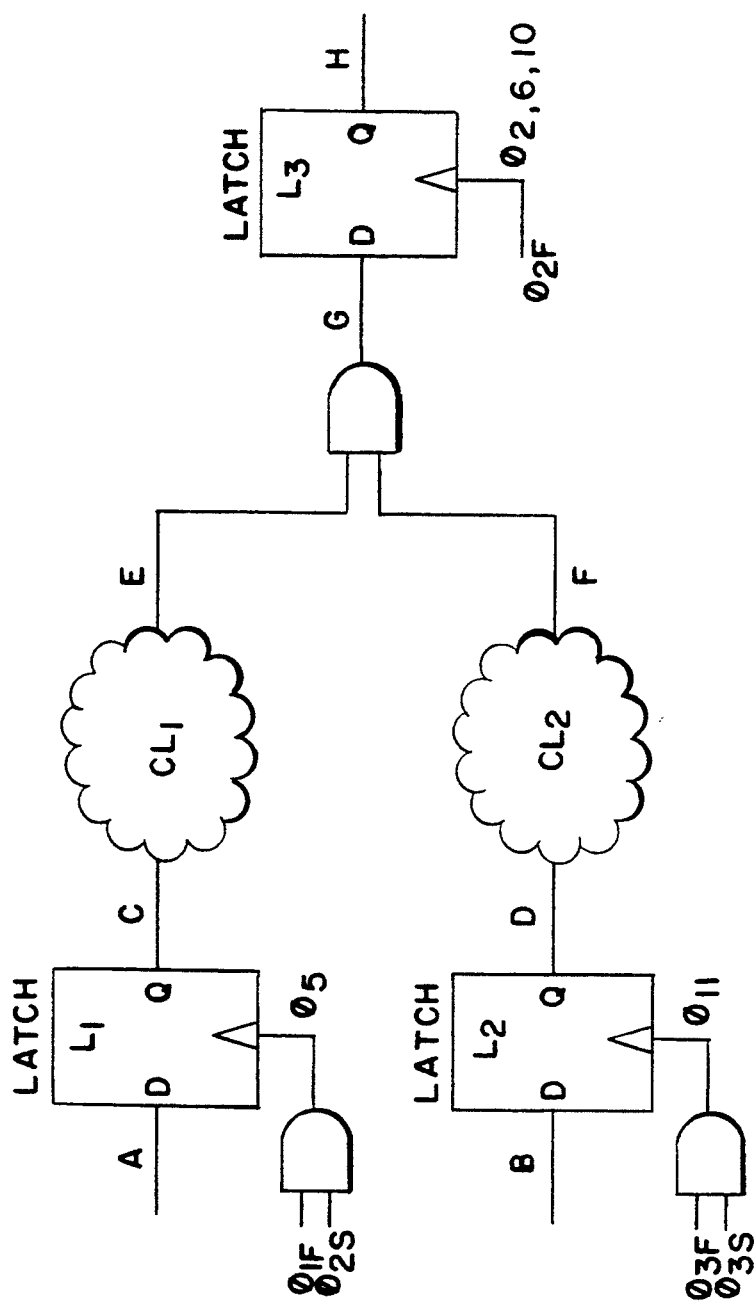
FIG. 15 is a schematic diagram of a hypothetical circuit.
Figure 16:
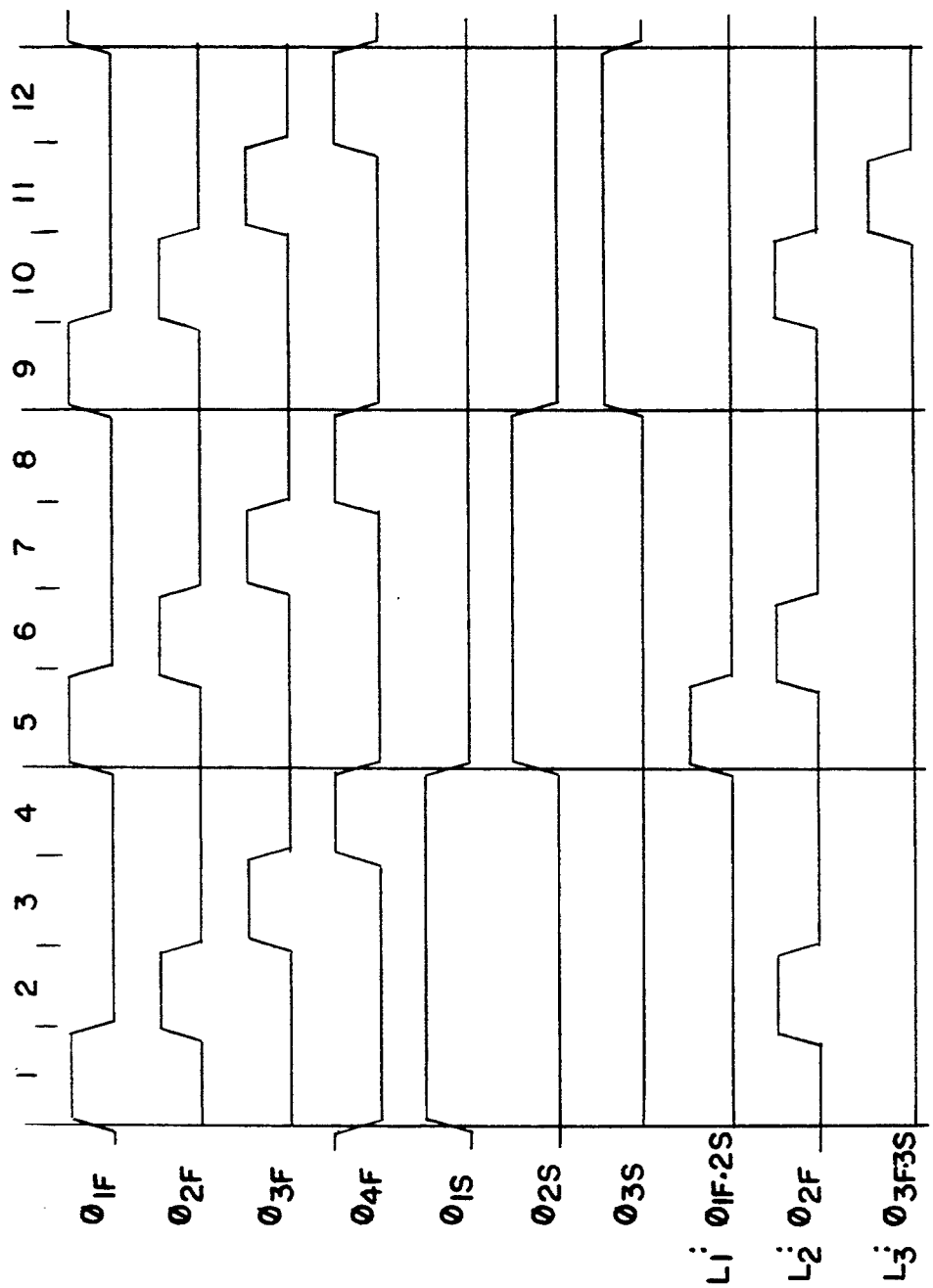
FIG. 16 is a timing diagram of the circuit of FIG. 15.

The circuit of FIG. 15 is driven by the $\phi_F$ and $\phi_S$ clocks of FIG. 6. A first latch $L_1$ gated with a composite clock $\phi_{1F}\phi_{2S}=\phi_5$ drives combinatorial logic $CL_1$. A second latch $L_2$ gated by composite clock $\phi_{3F}\phi_{3S}=\phi_{11}$ drives combinatorial logic $CL_2$. $CL_1$ and $CL_2$ in turn drive a third latch $L_3$ gated by $\phi_{2F}=\phi_{2,6,10}$. The various clock signals are plotted against the composite clock in FIG. 16. At the end of part one, node G is labelled with two transitions, $(\phi_5+X,E)$ and $(\phi_{11}+Y,F)$, where X is the latest time into $\phi_5$ at which A stabilizes, plus the delay time of $CL_1$, the delay of the AND gate, and the propagation/setup requirements of the latches $L_1$ and $L_3$, and Y is the latest time into $\phi_{11}$ at which B stabilizes, plus the delay time of $CL_2$, the delay of the AND gate, and the propagation/setup requirements of latches $L_2$ and $L_3$.

Part two compares these two transitions against the three clock assertions of $L_3$:

1) $\phi_5+X$ compared against the $\phi_6$ closing of $L_3$. If X is less than one phase width, the input to the latch stabilizes before the latch opens, and the walk stops here. If X is more than one but less than two phase widths, the input is still undergoing a transition while the latch is transparent, and the path will be traced further downstream. If X is more than two phase widths, a timing violation is reported, and the DFS walk continues.

2) $\phi_5+X$ compared against the $\phi_{10}$ closing of $L_3$. The path will be further propagated if and only if X is more than five phase widths.

3) $\phi_5+X$ compared against the $\phi_2$ closing of $L_3$. The path will be further propagated if and only if X is more than nine phase widths.

4) $\phi_{11}+Y$ compared against the $\phi_2$ closing of $L_3$. The path will be further propagated if and only if Y is more than three phase widths.

5) $\phi_{11}+Y$ compared against the $\phi_6$ closing of $L_3$. The path will be further propagated if and only if Y is more than seven phase widths.

6) $\phi_{11}+Y$ compared against the $\phi_{10}$ closing of $L_3$. The path will be further propagated if and only if Y is more than eleven phase widths.

The paths represented by comparisons 1) and 4) are the most critical. It is unlikely that paths 2), 3), 5), or 6) will be traced.

If X, the delay through $CL_1$, is more than two phase widths, the designer may have intended that node G stabilize to meet latch $L_3$ at $\phi_{10}$, as noted in combination 2). But in this case, node G may be undergoing a transition during the $\phi_6$ opening of the latch, and thus node H would be metastable, causing potential system failure. The NTV implementation enforces the worst-case constraints of combination 1), and thus reports it as a violation.

By checking as many constraints as possible, the timing verifier discovers as many timing violations as possible. Note that the effect of propagating all paths whose transition time is later than the latch opening time is to relax the pruning and to propagate as many paths as possible, and thus to discover as many timing violations as possible. The timing violations that are discovered are the ones that affect correct system function.

The method is readily adaptable to timing verifiers that use other basic algorithms. For instance, the depth-first search could be replaced by a topological sort on the nodes of the circuit; the walk would be done in a natural order, queueing each node onto a ready list when all its driving nodes have been visited. In this case, the part one time propagation and part two comparison would be modified analogously.

Within the conceptual framework presented above, NTV uses several techniques to compress the storage required for the node and transition data structures. Known timing verifiers have annotated multiple transitions per node (typically two per phase boundary, one for the clock signal that has a rising edge on that boundary, one for the edge that falls) by including an array of transition data structures in the node data structure. But the invention's combinatorial explosion of clock edges renders this strategy impractical. For instance, a twelve-phase analysis of the $\phi_{1F-4F}$ and $\phi_{1S-3S}$ clocks of FIG. 9 would require an array of 30 transitions on each node, one for each of the fifteen rising or falling edges shown for the seven clocks. For a large circuit, there may be on the order of a million nodes. Empirical observation shows that almost all nodes are labelled with a maximum of two transitions. The resultant low ratio of used memory to virtual memory space allocated can cause very poor paging behavior in a virtual memory system.

In spite of the overwhelming majority of nodes' requirements for only two transitions, the requirement for labelling some nodes with many transitions remains, and the timing verifier cannot a priori predict which nodes are likely to become transition-rich during the analysis.

In the memory compression enhancement to the invention, transition data structures are discriminated into two kinds, "struct small_transition" and a full "struct transition." The node data structure itself has embedded a small array, length two, of small_transition's, saving the storage for pointers between the node and the transition, and the linked list pointer. Any transition in excess of the two small_transition's per node is allocated as a full "struct transition." The additional transitions are accessible from the node by means of a hash table keyed on the address of the node. The node data structure has a flag ".has_more_transitions;" when this flag is true, a program that needs to access all of the node's transitions must check the hash table as well as the embedded array. The node is accessible from a full "struct transition" by a pointer to the node in the transition.

To further compress storage, some of the members of the data structures are packed into C bit fields.

TABLE 3

NTV data structures

```
struct transition {
    struct transition    *predecessor;        /*input x'ition causing this one */
    int                  arrival_time;         /* the time stamp. */
    unsigned             rising : 1;           /* rising x'ition or falling one? */
    unsigned             unconditional : 1;
    unsigned             phase : 4;            /* what phase is the transition in */
    struct node_rec      *node;                /* Node which the transition is on */
    struct transition    *next;                /* Next in hash list */
};
/* One of the first two transitions. It doesn't need a node or next */
/* field, since it's not part of a hash table. */
struct small_transition {
    struct transition    *predecessor;        /* input x'ition causing this one. */
    int                  arrival_time;         /* the time stamp. */
    unsigned             rising : 1;           /* rising transition or falling? */
    unsigned             unconditional :1;
    unsigned             phase : 4;            /* phase transition is in */
};
struct node {
    ...
    unsigned has_more_transitions : 1; /* node has >2 x'itions */
    struct small_transition transitions[2];
    ...
}
```

The corresponding members of "struct transition" and "struct small_transition" must be kept in corresponding positions in the respective data structure declarations, so that the ".predecessor" member, a pointer to a "struct transition," can point to a "struct small_transition." Some programming languages, for instance Pascal, allow the declaration of variant records, so that this consistency will be maintained automatically. In C, the consistency can be automatically enforced by coding the common body of the two structs in a macro, and then invoking the macro inside the curly braces of the two struct declarations, as shown in table 4.

TABLE 4

An example of enforcing consistency via a macro

```
#define TRANSITION_BODY
    struct transition    *predecessor;        /*input x'ition causing this one */
    int                  arrival time;         /* the time stamp. */
    unsigned             rising : 1;           /* rising x'ition or falling one? */
    unsigned             unconditional : 1;
    unsigned             phase : 4;            /* phase transition relative to */
```

TABLE 4-continued

An example of enforcing consistency via a macro

```
struct transition {
  TRANSITION_BODY
    struct node_rec    *node;    /* Node which the transition is on */
    struct transition  *next;    /* Next transition in hash bucked */
};
struct small_transition {
  TRANSITION_BODY
};
```

The described memory compression scheme offers the following advantages over the prior art technique of representing the transitions as an array of transitions within the node data structure. Very little memory is wasted: only what will be used is allocated.

The described memory compression scheme offers the following advantages over the prior art technique of representing the transitions as a linked list of transitions off the node data structure. The two nodes in the node data structure can be stripped of their pointers to the node, saving a word of storage per transition in the common case. The node data structure itself has no linked list header, saving a word of storage per node in the common case. The transitions are co-located with the node, resulting in better virtual memory and cache locality. A program can access the transitions arrayed in the node much faster than it could if they were in a linked list.

Figure 18:
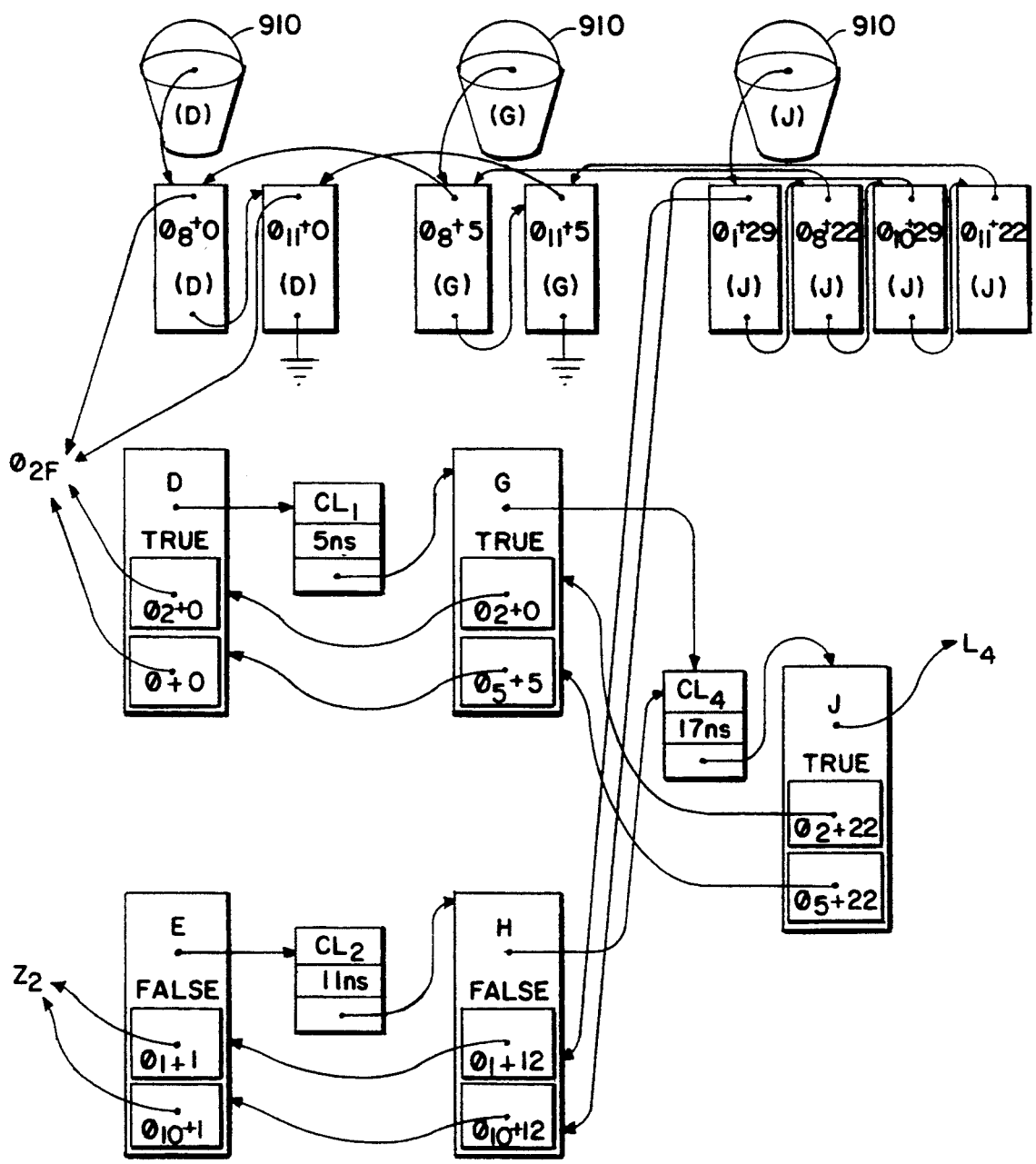
FIG. 18 is a diagram of a data configuration during the execution of a timing verifier.

See also FIG. 17a for "struct transition," FIG. 17b for "struct small_transition," and FIG. 17c for "struct node." FIG. 18 shows the same configuration as FIG. 14c. The nodes owning two transitions, E and H, have the transitions in the array of small_transition's. The nodes owning more than two transitions, D, G, and J, access the excess transitions through the hash table, via hash buckets 910.

Other embodiments are within the scope of the following claims.

The method is readily adaptable to timing verifiers that use other basic algorithms. For instance, the depth-first search could be replaced by a topological sort on the nodes of the circuit; the walk would be done in a natural order, queueing each node onto a ready list when all its driving nodes have been visited. In this case, the part one time propagation and part two comparison would be modified analogously.

The method can be used with timing verifiers that compute timing information for multiple phases and senses, and with timing verifiers that work on transistor-, gate- or functional block-level designs.

What is claimed is:

1. A method for improving a circuit design through static analysis of a software model of said circuit, said circuit designed to be clocked by two clocks, each of said clocks being characterized by a period, each of said clocks' periods being a multiple of a greatest common divisor period, the method comprising the steps of
   determining a least common multiple period of said clocks,
   defining a composite clock, said composite clock having a period equal to said least common multiple period, and
   statically analyzing in a computer said model relative to said composite clock.

2. The method of claim 1 wherein said model comprises nodes and transitions, said transitions labelling said nodes with worst-case transition times and predecessors.

3. The method of claim 2 wherein said circuit comprises a clocked device with a clock input, a first node being the data input to said clocked device and a second node being the clock input to said device, further comprising the step of
   comparing the transition times of each of said transitions of said first node to the transition times of each of said transitions of said second node.

4. The method of claim 3 wherein the analyzing step comprises a walk of said model, said walk having a terminating condition, wherein said terminating condition comprises said comparing.

5. The method of claim 2 wherein said circuit comprises a primary input node, each said node having a plurality of input transitions, the method further comprising beginning a plurality of depth-first walks of said model at said primary input node, each of said walks corresponding to one of said input transitions.

6. The method of claim 1 wherein said circuit comprises a latch with a data input and a clock input wherein assertion of said clock makes said latch transparent, and wherein the analyzing step comprises tracing paths of said circuit with respect to the boundaries of said composite clock, and said tracing comprises a termination condition, wherein said tracing continues if the transition time of said data input is later than the time of a clock transition that makes said latch transparent.

7. The method of claim 1 wherein said model comprises nodes and transitions labelling said nodes, each of said transitions comprising a time value, wherein
   said time value comprises a reference to a phase boundary of said composite clock and an offset relative to said phase boundary.

8. The method of claim 7 wherein the analyzing step comprises a walk of said model, said walk comprising maintaining an arrival time, said arrival time comprising a reference to a phase boundary of said composite clock and an offset relative to said phase boundary, wherein
   the analyzing step comprises a pruning condition, and
   said pruning condition comprises comparing the phase boundary of said arrival time to the phase boundary of the time value of one of said transitions.

9. The method of claim 1 wherein said circuit comprises a latch with a clock input such that assertion of said clock makes said latch transparent, wherein the analyzing step analyzes said model relative to multiple clock assertions, and thereby multiple latch transparencies, per cycle of said composite clock.

* * * * *